(12) United States Patent
Tabira

(10) Patent No.: US 7,655,506 B2
(45) Date of Patent: Feb. 2, 2010

(54) LEADLESS TYPE SEMICONDUCTOR PACKAGE, AND PRODUCTION PROCESS FOR MANUFACTURING SUCH LEADLESS TYPE SEMICONDUCTOR PACKAGE

(75) Inventor: Yukinori Tabira, Kawasaki (JP)

(73) Assignee: NEC Electronics Corporation, Tokyo (JP)

( * ) Notice: Subject to any disclaimer, the term of this patent is extended or adjusted under 35 U.S.C. 154(b) by 0 days.

(21) Appl. No.: 11/620,481

(22) Filed: Jan. 5, 2007

(65) Prior Publication Data

US 2007/0105281 A1      May 10, 2007

Related U.S. Application Data

(62) Division of application No. 10/917,496, filed on Aug. 13, 2004, now Pat. No. 7,166,919.

(30) Foreign Application Priority Data

Sep. 1, 2003     (JP) ............................. 2003-308571

(51) Int. Cl.
*H01L 21/00*     (2006.01)
(52) U.S. Cl. .................. 438/113; 438/106; 438/121; 438/124; 257/E21.001
(58) Field of Classification Search ................. 438/113, 438/114, 124; 257/E21.001
See application file for complete search history.

(56) References Cited

U.S. PATENT DOCUMENTS

| | | | |
|---|---|---|---|
| 5,656,550 A * | 8/1997 | Tsuji et al. ................... | 438/123 |
| 5,969,426 A | 10/1999 | Baba et al. | |
| 5,977,613 A * | 11/1999 | Takata et al. ................ | 257/666 |
| 6,191,494 B1 | 2/2001 | Ooyama et al. | |
| 6,201,292 B1 * | 3/2001 | Yagi et al. ................... | 257/666 |
| 6,399,415 B1 | 6/2002 | Bayan et al. | |
| 6,580,161 B2 * | 6/2003 | Kobayakawa ................ | 257/676 |
| 6,608,366 B1 * | 8/2003 | Fogelson et al. ............ | 257/666 |
| 6,713,868 B2 * | 3/2004 | Ueno .......................... | 257/730 |
| 6,759,737 B2 * | 7/2004 | Seo et al. .................... | 257/686 |
| 6,812,552 B2 * | 11/2004 | Islam et al. .................. | 257/666 |
| 6,861,734 B2 * | 3/2005 | Minamio et al. ............ | 257/666 |
| 6,872,599 B1 * | 3/2005 | Li et al. ....................... | 438/123 |
| 6,913,950 B2 * | 7/2005 | Kobayakawa ................ | 438/113 |
| 2002/0005573 A1 * | 1/2002 | Maeda ........................ | 257/678 |

FOREIGN PATENT DOCUMENTS

JP     56-100420 A     12/1981

(Continued)

*Primary Examiner*—Charles D Garber
*Assistant Examiner*—Angel Roman
(74) *Attorney, Agent, or Firm*—Sughrue Mion, PLLC

(57) ABSTRACT

A leadless type resin-sealed semiconductor package includes a resin enveloper having a mounting face to be applied to a wiring board, and at least one side face associated with the mounting face to produce an angled side edge. A semiconductor chip is encapsulated and sealed in the resin enveloper. An electrode terminal is partially buried in the angled side edge of the resin enveloper so as to be exposed to an outside, with the electrode terminal being electrically connected to the semiconductor chip. The electrode terminal is formed with a depression which is shaped so as to be opened to an outside when the resin enveloper is placed on the wiring board such that the mounting face of the resin enveloper is applied thereto.

10 Claims, 16 Drawing Sheets

FOREIGN PATENT DOCUMENTS

| | | |
|---|---|---|
| JP | 04-211177 A | 8/1992 |
| JP | 07-226396 A | 8/1995 |
| JP | 2000-294715 A | 10/2000 |
| JP | 2002-294719 A | 10/2000 |
| JP | 2001-77268 A | 3/2001 |
| JP | 2001-257304 A | 9/2001 |
| JP | 2001-326295 A | 11/2001 |
| JP | 2004-207275 A | 7/2004 |
| JP | 2004-279996 A | 11/2004 |

* cited by examiner

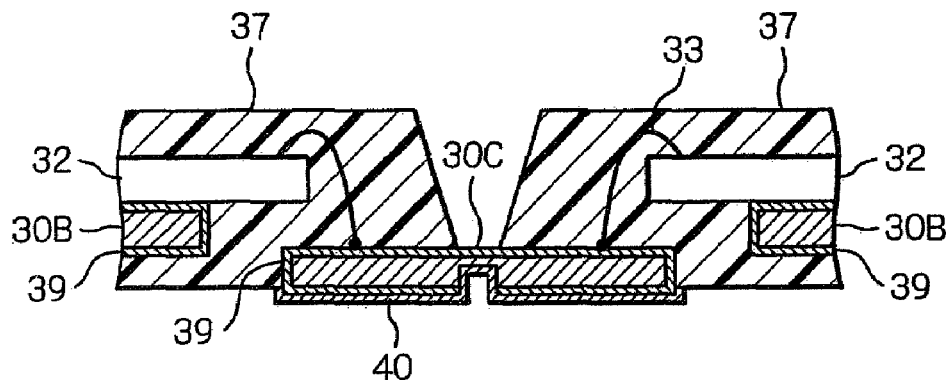
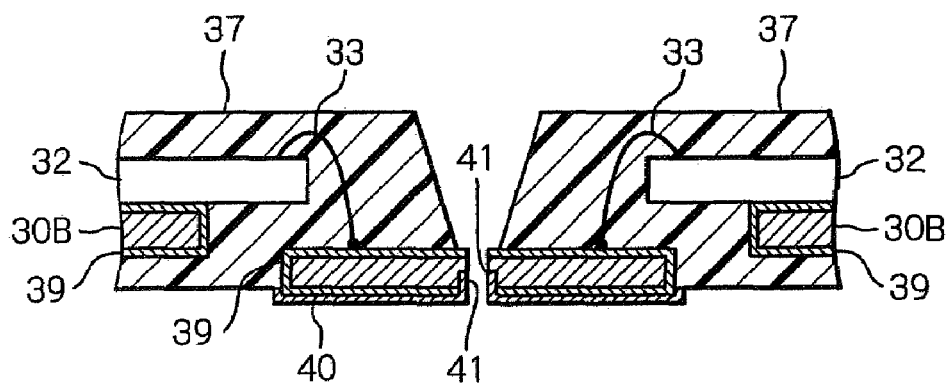
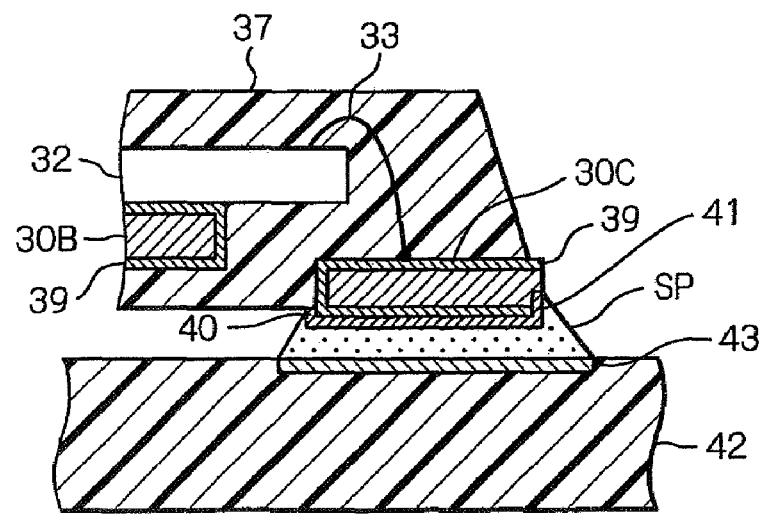

US 7,655,506 B2

LEADLESS TYPE SEMICONDUCTOR PACKAGE, AND PRODUCTION PROCESS FOR MANUFACTURING SUCH LEADLESS TYPE SEMICONDUCTOR PACKAGE

BACKGROUND OF THE INVENTION

1. Field of the Invention

The present invention relates to a leadless type resin-sealed semiconductor package having no outer leads outwardly extending from a periphery thereof, and a production process for manufacturing such a leadless type resin-sealed semiconductor package.

2. Description of the Related Art

In general, a conventional resin-sealed semiconductor package includes an island or plate-like mount, a semiconductor chip securely mounted on the plate-like mount and having a plurality of electrode pads provided on a top surface thereof, a plurality of leads electrically connected to the respective electrode pads of the semiconductor chip through the intermediary of bonding wires, and a molded resin enveloper encapsulating and sealing the plate-like mount, the semiconductor chip, and the inner portions of the leads, with the outer portions of the leads outwardly and laterally extending from sides of the molded resin enveloper. The resin-sealed semiconductor package is mounted on a suitable wiring board such that the outer portions of the leads are electrically contacted with and bonded to electrode pads provided and arranged on the wiring board.

Of course, this resin-sealed semiconductor package is undesirable in application to a miniature or compact piece of electronic equipment in that the outwardly and laterally extending outer portions of the leads result in overall bulkiness of the resin-sealed semiconductor package.

A leadless type resin-sealed semiconductor package has been developed to be more compactly arranged in comparison with the aforesaid conventional resin-sealed semiconductor package. In particular, the leadless type resin-sealed semiconductor package includes an island or plate-like mount, a semiconductor chip mounted on the plate-like mount and having electrode pads provided on a top surface thereof, a molded resin enveloper encapsulating and sealing the semiconductor chip, and electrode pads provided on the molded resin enveloper and electrically connected to the electrode pads of the semiconductor chip. The leadless type resin-sealed semiconductor package is mounted on a suitable wiring board such that the electrode pads provided on the molded resin enveloper are electrically contacted with and soldered to electrode pads provided and arranged on the wiring board, using a suitable solder paste.

Nevertheless, this leadless type resin-sealed semiconductor package fails to obtain a sufficient mounting strength between the semiconductor package and the wiring board. In particular, when each of the electrode pads provided on the molded resin enveloper is soldered to a corresponding electrode pad provided on the wiring board, a solder fillet is produced between the soldered electrode pads. The soldering strength of the soldered electrode pads, and therefore, the mounting strength between the semiconductor package and the wiring board, is evaluated by both an extent and a configuration of the produced solder fillet. However, in the conventional leadless type resin-sealed semiconductor package, the extent of the solder fillet is relatively small, and it is difficult or troublesome to visually inspect the configuration of the solder fillet, as explained in detail hereinafter.

JP-A-2001-077268 discloses a leadless type resin-sealed semiconductor package, which is constructed so that a large mounting strength can be obtained when the leadless type resin-sealed semiconductor package is mounted on a wiring board. Nevertheless, a production process of this semiconductor package involves some additional processes to obtain the large mounting strength, resulting in an increase in production cost therefor, as explained in detail hereinafter.

SUMMARY OF THE INVENTION

Therefore, an object of the present invention is to provide a leadless type resin-sealed semiconductor package, which is constructed such that a large mounting strength can be obtained without substantially increasing the production cost thereof, and such that configurations of solder fillets can be visually and easily inspected when electrode pads of the leadless type resin-sealed semiconductor package are soldered to electrode pads provided on a wiring board.

Another object of the present invention is to provide a production process for manufacturing the above-mentioned leadless type resin-sealed semiconductor package.

In accordance with a first aspect of the present invention, there is provided a leadless type rein-sealed semiconductor package comprising: a resin enveloper having a mounting face to be applied to a wiring board, and at least one side face associated with the mounting face to produce an angled side edge; a semiconductor chip encapsulated and sealed in the resin enveloper; and at least one electrode terminal partially buried in the angled side edge of the resin enveloper so as to be exposed to an outside, the electrode terminal being electrically connected to the semiconductor chip. The electrode terminal is formed with a depression which is shaped so as to be opened to an outside when the resin enveloper is placed on the wiring board such that the mounting face of the resin enveloper is applied thereto.

If the depression of the electrode terminal exhibits a poor adhesive property to a solder to be used, it should by subjected to a surface treatment so as to exhibit the excellent adhesive property to the solder to be used. The surface treatment may comprise an electroplating process.

Preferably, the angled side edge of the resin enveloper defines a right angle, and the depression of the electrode terminal is formed as a right-angled depression.

The leadless type resin-sealed semiconductor package may further comprise a plate-like mount encapsulated and sealed in the resin enveloper, and the semiconductor chip is mounted on the plate-like mount. When the semiconductor chip has an electrode layer which is formed as a lowermost layer thereof, and which is electrically connected to the plate-like mount, the electrode terminal may be integrally joined to the plate-like mount. Also, when the semiconductor chip has at least one electrode terminal formed a top surface thereof, the electrode terminal, partially buried in the angled side edge of the resin enveloper, may be electrically connected to the electrode terminal of the semiconductor chip through the intermediary of a bonding wire.

On the other hand, when the semiconductor chip has at least one electrode terminal formed a top surface thereof, the electrode terminal, partially buried in the angled side edge of the resin enveloper, may be directly connected to the electrode terminal of the semiconductor chip. Namely, the semiconductor chip is faced down such that the electrode terminal thereof is directed bonded on the electrode terminal partially buried in the angled side edge of the resin enveloper.

In accordance with a second aspect of the present invention, there is provided a production process for manufacturing a plurality of leadless type resin-sealed semiconductor packages, comprising the steps of: preparing a metal electrode frame including a plurality of plate-like mounts, and a plurality of electrodes regularly associated with the plate-like mounts, each of the electrodes having a recess formed in a bottom surface thereof; mounting respective semiconductor chips on the plate-like mounts such that a bottom surface of each of the semiconductor chips is securely bonded thereto, each of the semiconductor chips having electrode terminals formed on a top surface thereof; establishing electrical connections between the electrode terminals of each of the semiconductor chips and a part of the electrodes of the metal electrode frame; receiving the metal electrode frame carrying the semiconductor chips in a molding cavity defined by mold dies, each of the electrodes being in contact with an inner surface defining the molding cavity, such that the recess of each of the electrodes is completely closed by the inner surface; introducing an uncured resin material into the molding cavity to thereby form a molded resin enveloper that completely encapsulates and seals the semiconductor chips, and that partially encapsulates and seals the electrodes such that the bottom surfaces of the electrodes are exposed on an outer surface of the molded resin enveloper; removing the molded resin enveloper from the mold dies after the introduced resin material is cured; and cutting and dividing the molded resin enveloper into a plurality of leadless type resin-sealed semiconductor packages, each of the leadless type resin-sealed semiconductor packages including a resin enveloper section cut from the molded resin enveloper, one of the plate-like mounts encapsulated and sealed in the resin enveloper section, a semiconductor chip mounted on the plate-like mount concerned, and electrode terminals cut from the electrodes and electrically connected to the semiconductor chip concerned, wherein each of the electrode terminal features a depression derived from the recess of a corresponding electrode.

In this production process, if the depression of the electrode terminal exhibits a poor adhesive property to a solder to be used, it should by subjected to a surface treatment so as to exhibit the excellent adhesive property to the solder to be used. The surface treatment may comprise an electroplating process.

When the semiconductor chip has an electrode layer which is formed as a lowermost layer thereof, and which is electrically connected to the plate-like mount, at least one included in the part of the electrodes may be integrally joined to the plate-like mount, resulting in the establishment of the electrical connection of the at least one included in the part of the electrodes to the semiconductor chip concerned. When the semiconductor chip has at least one electrode terminal formed on a top surface thereof, the electrode terminal may be electrically connected to the remainder, included in the part of the electrodes, by a bonding wire, resulting in the establishment of the electrical connection of the remainder included in the part of the electrodes to the semiconductor chip concerned.

On the other hand, when the semiconductor chip has not an electrode layer formed as a lowermost layer thereof, i.e. when the semiconductor chip has at least one electrode terminal formed on a top surface thereof, the electrode terminal may electrically connected to the part of the electrodes by a bonding wire, resulting in the establishment of the electrical connection of the part of the electrodes to the semiconductor chip concerned.

In accordance with a third aspect of the present invention, there is provided a production process for manufacturing a plurality of leadless type resin-sealed semiconductor packages, comprising the steps of: preparing a metal electrode frame including a plurality of electrodes, each of which has a recess formed in a bottom surface thereof; preparing semiconductor chips having at least one electrode terminal formed on a top surface thereof; facing down and mounting each of the semiconductor chips on the metal electrode frame such that the electrode terminal of the semiconductor chip concerned is directly electrically bonded on a corresponding one of the electrodes; receiving the metal electrode frame carrying the semiconductor chips in a molding cavity defined by mold dies, each of the electrodes being in contact with an inner surface defining the molding cavity, such that the recess of each of the electrodes is completely closed by the inner surface; introducing an uncured resin material into the molding cavity to thereby form a molded resin enveloper that completely encapsulates and seals the semiconductor chips, and that partially encapsulates and seals the electrodes such that the bottom surfaces of the electrodes are exposed on an outer surface of the molded resin enveloper; removing the molded resin enveloper from the mold dies after the introduced resin material is cured; and cutting and dividing the molded resin enveloper into a plurality of leadless type resin-sealed semiconductor packages, each of the leadless type resin-sealed semiconductor packages including a resin enveloper section cut from the molded resin enveloper, a semiconductor chip encapsulated and sealed in the resin enveloper section, and electrode terminals cut from the electrodes and electrically connected to the semiconductor chip concerned, wherein each of the electrode terminal features a depression derived from the recess of a corresponding electrode.

Similar to the second aspect of the present invention, if the depression of the electrode terminal exhibits a poor adhesive property to a solder to be used, it should by subjected to a surface treatment so as to exhibit the excellent adhesive property to the solder to be used. Also, the surface treatment may comprise an electroplating process.

BRIEF DESCRIPTION OF THE DRAWINGS

The above objects and other objects will be more clearly understood from the description set forth below, with reference to the accompanying drawings, wherein:

FIG. 7E is an enlarged cross-sectional view of the resin-molded metal electrode frame subjected to a silver-plating process, for explaining a fifth representative step of the second conventional production process;

FIG. 7F is an enlarged cross-sectional view of the resin-molded metal electrode frame subjected to a full-cutting process, for explaining a sixth representative step of the second conventional production process;

FIG. 8 is an enlarged cross-sectional view of the leadless type resin-sealed semiconductor package produced by the second conventional production process and mounted on a wiring board;

DESCRIPTION OF THE PREFERRED EMBODIMENTS

Before descriptions of embodiments of the present invention, for better understanding of the present invention, a first conventional production process for manufacturing a plurality of leadless type semiconductor packages will be explained with reference to FIGS. 1A, 1B, 2A, 2B, 3A, 3B, 4A, and 4B.

Figure 1A:
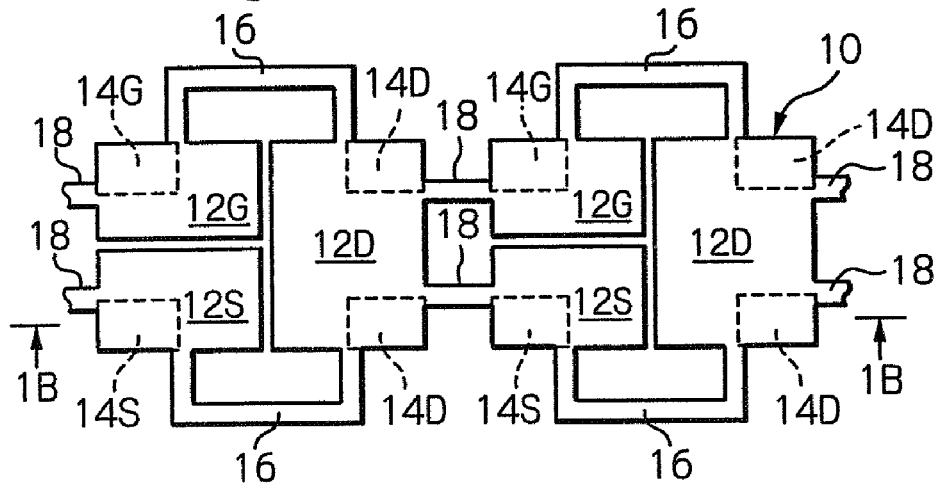
FIG. 1A is a plan view of a metal electrode frame, for explaining a first representative step of a first conventional production process for manufacturing a plurality of leadless type resin-sealed semiconductor packages.
Figure 1B:
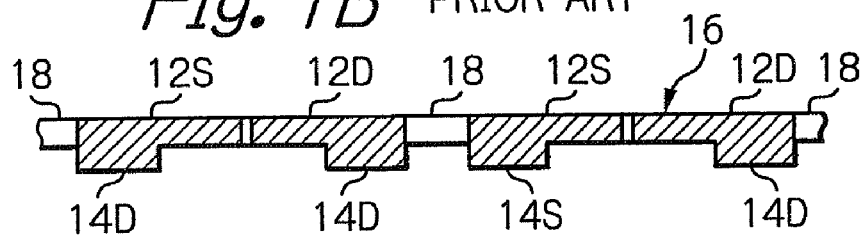
FIG. 1B is a cross-sectional view taken along the 1B-1B line of FIG. 1A.

First, as shown in FIGS. 1A and 1B, a metal electrode frame 10 is prepared. The metal electrode frame 10 is made of a suitable metal material, such as copper, brass or the like, and includes plural sets of three plate-like electrodes 12D, 12S and 12G. Each of the plate-like electrode 12D, 12S and 12G has a rectangular shape, and the plate-like electrode 12D is approximately two times larger than the plate-like electrodes 12S and 12G having substantially the same size as each other.

As is apparent from FIG. 1A, the three of the plate-like electrodes 12D, 12S and 12G in each set are arranged to define a rectangle having a size which is approximately two times larger than the plate-like electrode 12D. Each of the plate-like electrodes 12D is provided with a pair of rectangular lands 14D integrally swelled from a bottom surface thereof, and the respective plate-like electrode 12S and 12G are provided with rectangular electrodes 14S and 14G integrally swelled from bottom surfaces thereof. The respective four rectangular lands 14D, 14S and 14G are arranged at the corners of the rectangle defined by the plate-like electrodes 12D, 12S and 12G.

In each set, the respective plate-like electrodes 12S and 12G are integrally joined to the plate-like electrode 12D by two handle-shaped side tie-bar elements 16. Also, the plate-like electrode 12D in each set is integrally joined to the plate-like electrodes 12S and 12G, included in the adjacent set, by two straight tie-bar elements 18.

Figure 2A:
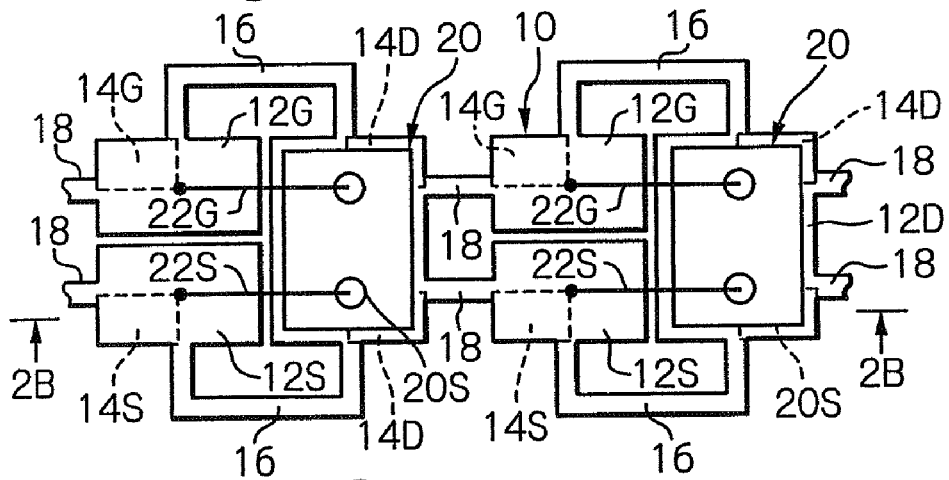
FIG. 2A is a plan view of the metal electrode frame having semiconductor chips mounted thereon, for explaining a second representative step of the first conventional production process.
Figure 2B:
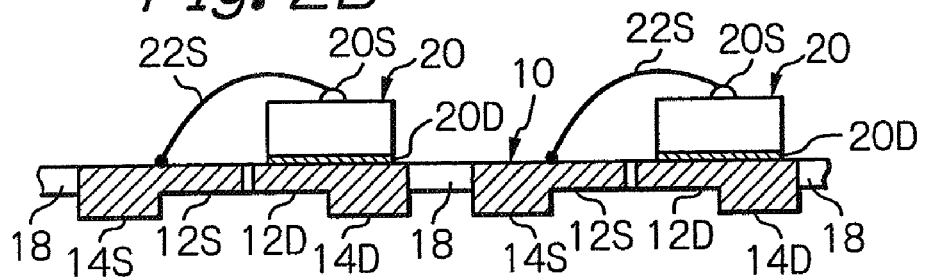
FIG. 2B is a cross-sectional view taken along the 2B-2B line of FIG. 2A.

After the preparation of the metal electrode frame 10, as shown in FIGS. 2A and 2B, respective semiconductor chips 20 are mounted on the plate-like electrodes 12D. Namely, each of the plate-like electrodes serves as a plate-like mount for a corresponding semiconductor chip 20. Each of the semiconductor chips 20 may be constructed as a vertical type power metal oxide semiconductor field effect transistor (MOSFET) chip. Namely, the MOSFET chip 20 has a drain electrode layer 20D (see FIG. 2B) formed as a lowermost layer thereof, and the drain electrode layer 20D is electrically adhered to a corresponding plate-like electrode 12D with a suitable conductive adhesive agent, such as silver paste. Also, the MOSFET chip 20 has two source and gate electrode terminals 20S and 20G bonded on respective source and gate electrode pads (not shown) formed on a top surface thereof, and the respective source and gate electrode terminals 20S and 20G are electrically connected to the plate-like electrodes 12S and 12G with bonding wires 22S and 22G.

Figure 3A:
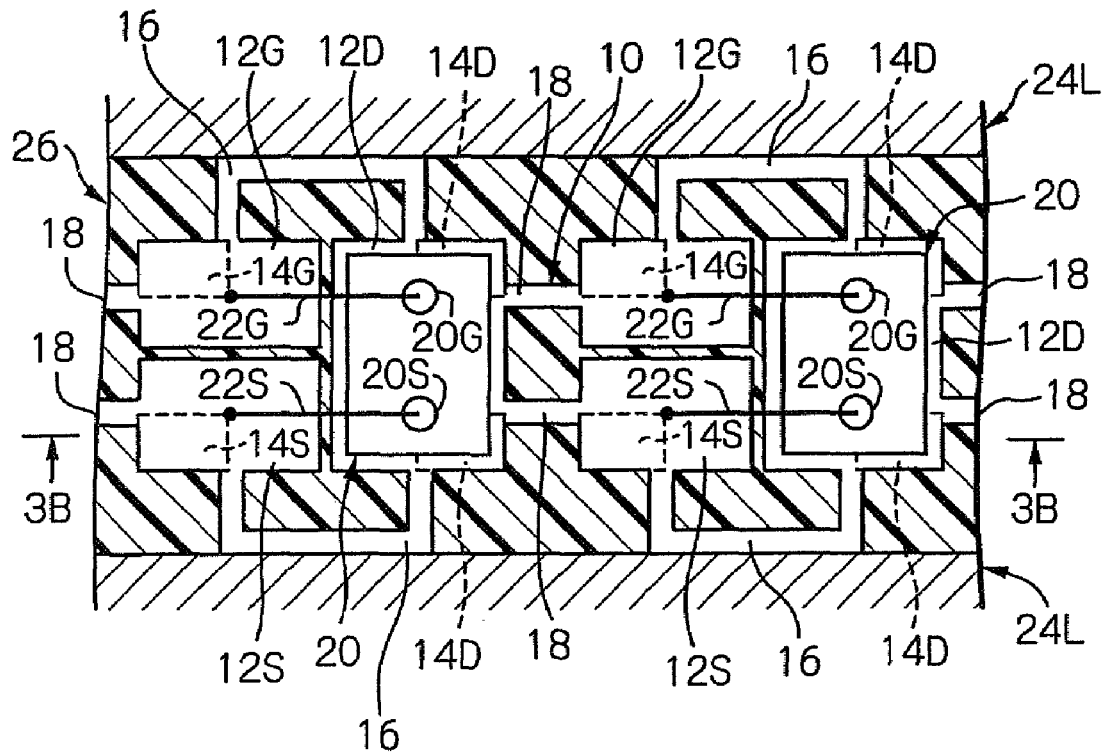
FIG. 3A is a horizontal cross-sectional view of a molding die, taken along the 3A-3A line of FIG. 3B, in which the metal electrode frame carrying the semiconductor chips is received and resin-molded, for explaining a third representative step of the first conventional production process.
Figure 3B:
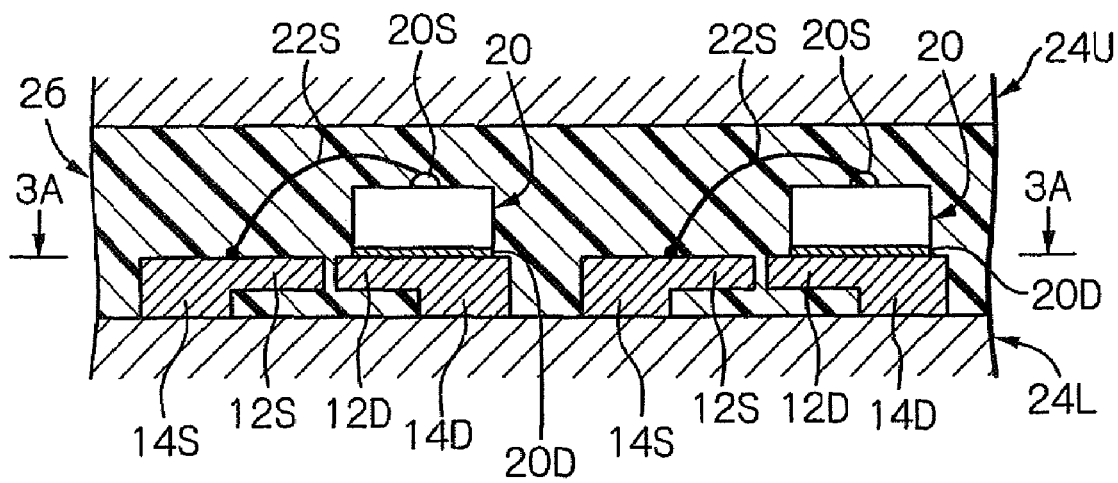
FIG. 3B is a cross-sectional view taken along the 3B-3B line of FIG. 3A.

After the mounting of the MOSFET chips 20 on the plate-like electrodes 12D, the metal electrode frame 10 carrying the MOSFET chips 20 is subjected to a molding process. Namely, as shown in FIGS. 3A and 3B, the metal electrode frame 10 carrying the MOSFET chips 20 is received in a molding cavity defined by lower and upper mold dies 24L and 24U (FIG. 3B), and is then molded with a suitable resin material, to thereby produce a molded resin enveloper 26 encapsulating and sealing the metal electrode frame 10 carrying the MOSFET chips 20. As shown in FIG. 3B, the rectangular lands 14D, 14S and 14G are in contact with an inner bottom surface of the lower mold die 24L, and thus the faces of these lands 14D, 14S and 14G are not covered with the resin material during the molding. Note, in FIG. 3A, only the molded resin enveloper 26 and the lower mold die 24L are shown in a cross-sectional view taken along the 3A-3A line of FIG. 3B.

Figure 4A:
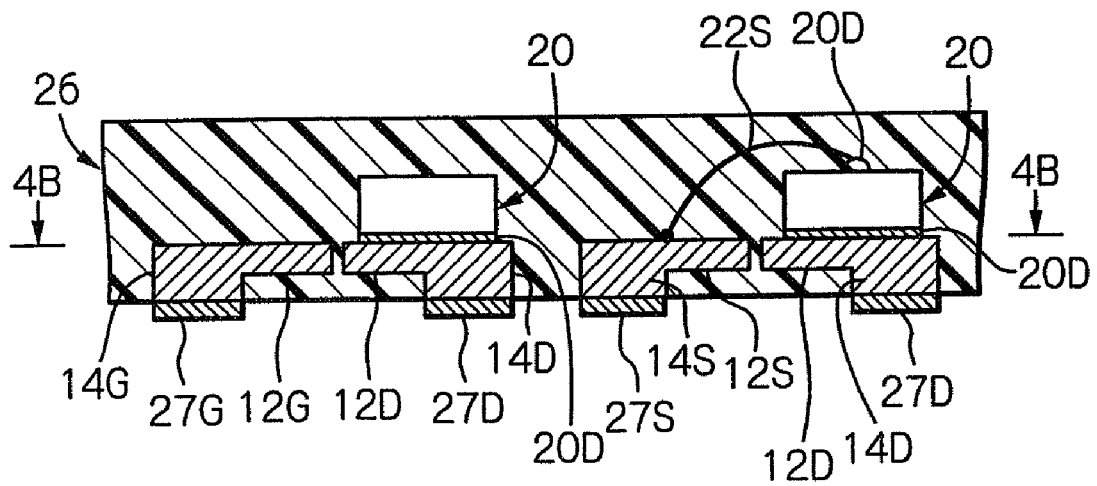
FIG. 4A is a cross-sectional view of the resin-molded metal electrode frame carrying the semiconductor chips, taken along the 4A-4A line of FIG. 4B, for explaining a fourth representative step of the first conventional production process.

After the molding process, the molded resin enveloper 26 encapsulating and sealing the metal electrode frame 10 with the MOSFET chips 20 is removed from the molding cavity of the lower and upper mold dies 24L and 24U. Then, as shown in FIG. 4A taken along a 4A-4A line of FIG. 4B, the molded resin enveloper 26 is subjected to a silver-electroplating process in which silver electrode pads 27D, 27D, 27S and 27G are formed on the exposed faces of the lands 14D, 14D, 14S and 14G not covered with the resin material. Note, each of the silver electrode pads 27D, 27D, 27S and 27G may have a thickness falling within a range from 20 to 30 µm.

Figure 4B:
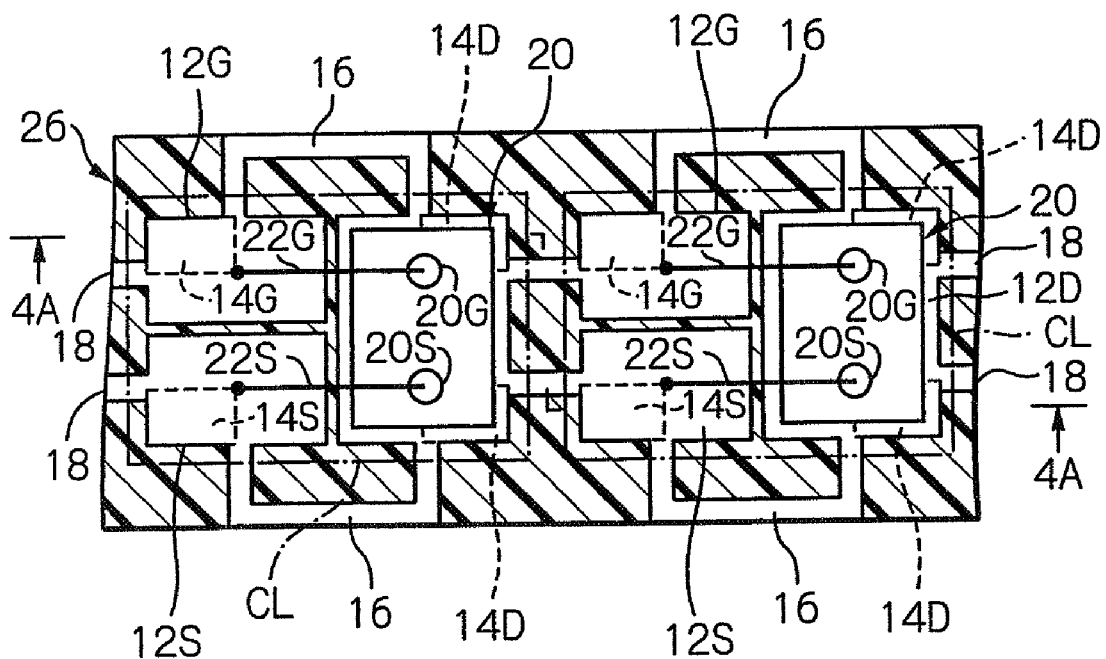
FIG. 4B is a horizontal cross-sectional view taken along the 4B-4B line of FIG. 4A, for explaining a fifth representative step of the first conventional production process.

After the formation of the electrode silver pads 27D, 27D, 27S and 27G, the molded resin enveloper 26 encapsulating and sealing the metal electrode frame 10 with the MOSFET chips 20 is subjected to a cutting process in which it is cut along rectangular cutting lines CL, represented by single-dot chain lines in FIG. 4B, to thereby produce a plurality of leadless type resin-sealed semiconductor packages.

Figure 5:
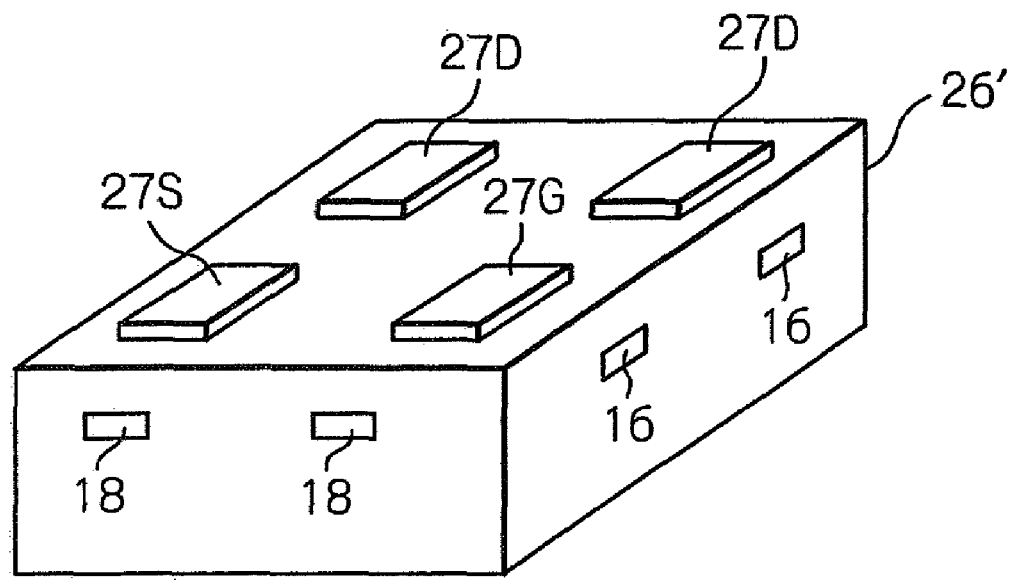
FIG. 5 is a perspective view of the leadless type resin-sealed semiconductor package manufactured by the first conventional production process.

Referring to FIG. 5, one of the produced leadless type resin-sealed semiconductor packages is representatively shown in a perspective view. This leadless type resin-sealed semiconductor package has a cut resin enveloper section 26' encapsulating and sealing the set of three plate-like electrodes 12D, 12S and 12G together with the semiconductor chip 20, with the four silver electrode pads 27D, 27D, 27S and 27G being projected from a bottom surface of the resin enveloper section 26'.

Figure 6:
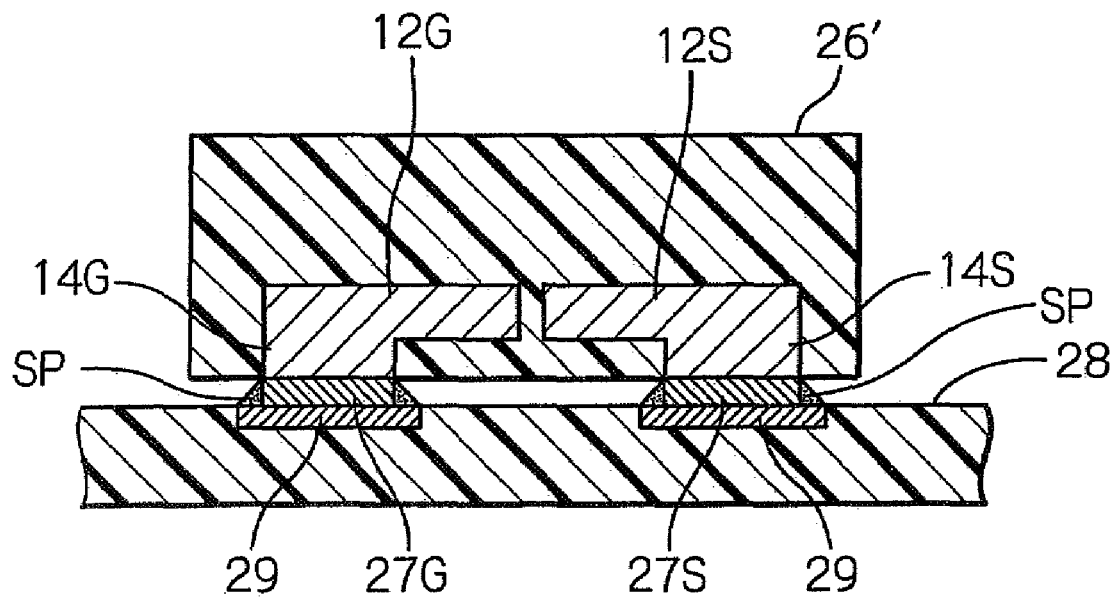
FIG. 6 is a cross-sectional view of the leadless type resin-sealed semiconductor produced of FIG. 5, which is mounted on a wiring board.

As shown in FIG. 6, this leadless type semiconductor package is mounted on a wiring board 28. In particular, the wiring board 28 has a circuit pattern formed thereon, and the circuit pattern includes four electrode pads 29 (only two of which are representatively shown in FIG. 6) having a larger size than that of the silver electrode pads 27D, 27D, 27S and 27G. The electrode pads 29 are made of a suitable metal material, such as copper, aluminum or the like, and are electroplated with silver. Also, the electrode pads 29 are arranged so as to have a mirror image relationship with respect to the arrangement of the four silver electrode pads 27D, 27D, 27S and 27G, and thus the leadless type semiconductor package can be placed on the wiring board 28 such that the respective silver electrode pads 27D, 27D, 27S and 27G are in contact with the four electrode pads 29. In short, the respective silver electrode pads 27D, 27D, 27S and 27G are soldered on the four electrode pads 29, using silver paste, resulting in a completion of the mounting of the leadless type semiconductor package on the wiring board 28. Note, in FIG. 6, the soldering of the silver electrode pads 27S and 27G is representatively indicated by references SP.

As is apparent from FIG. 6, when each of the silver electrode pads 27D, 27D, 27S and 27G are soldered on a corresponding electrode pad 29, a solder fillet is produced between the soldered electrode pads around each of the silver electrode pads 27D, 27D, 27S and 27G, but the extent of the produced solder fillet is very small because the thickness of the silver electrode pads 27D, 27D, 27S and 27G falls within the range from 20 to 30 µm. Thus, it is impossible to obtain a sufficient soldering strength between the soldered electrode pads, and therefore, a sufficient mounting strength between the leadless type semiconductor package and the wiring board 28 cannot be obtained.

Further, it is very difficult to visually inspect whether or not a configuration of the produced solder fillet is proper because it can be merely observed through a small gap (20 to 30 µm) between the bottom of the leadless type semiconductor package and the top surface of the wiring board 28.

Next, with reference to FIGS. 7A to 7F, a second conventional production process for manufacturing a plurality of leadless type semiconductor packages will be explained. Note, this second conventional production process is disclosed in the aforesaid JP-A-2001-077268.

Figure 7A:
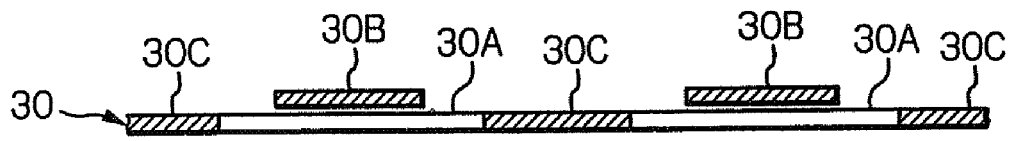
FIG. 7A is a cross-sectional view of a metal electrode frame, for explaining a first representative step of a second conventional production process for manufacturing a plurality of leadless type resin-sealed semiconductor packages.

First, as shown in FIG. 7A, a metal electrode frame 30 is prepared. The metal electrode frame 30 is made of a suitable metal material, such as copper, brass or the like, and includes an outer frame section 30A, a plurality of rectangular islands or plate-like mount 30B supported by the outer frame section 30A through the intermediary of tie-bar elements (not shown), and a plurality of elongated electrodes 30C arranged along the four sides of each of the rectangular plate-like mounts. Note, each of the tie-bar elements is shaped such that each of the plate-like mounts 30B is lifted up from a plan defined by the outer frame section 30A, as shown in FIG. 7A. Also, the metal electrode frame 30 is wholly electroplated with silver.

Figure 7B:
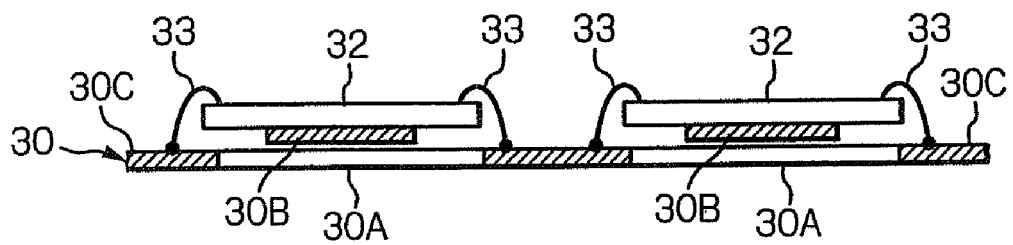
FIG. 7B is a cross-sectional view of the metal electrode frame having semiconductor chips mounted thereon, for explaining a second representative step of the second conventional production process.

After the preparation of the metal electrode frame 30, as shown in FIG. 7B, respective semiconductor chips 32, each of which has a plurality of electrode pads (not shown) provided and arranged on a top surface thereof, are securely mounted on the plate-like mounts 30B, using a suitable adhesive agent. Then, the respective electrode pads of each of the semiconductor chips 32 are electrically connected to the elongated electrodes 30C with bonding wires 33, as shown in FIG. 7B.

Figure 7C:
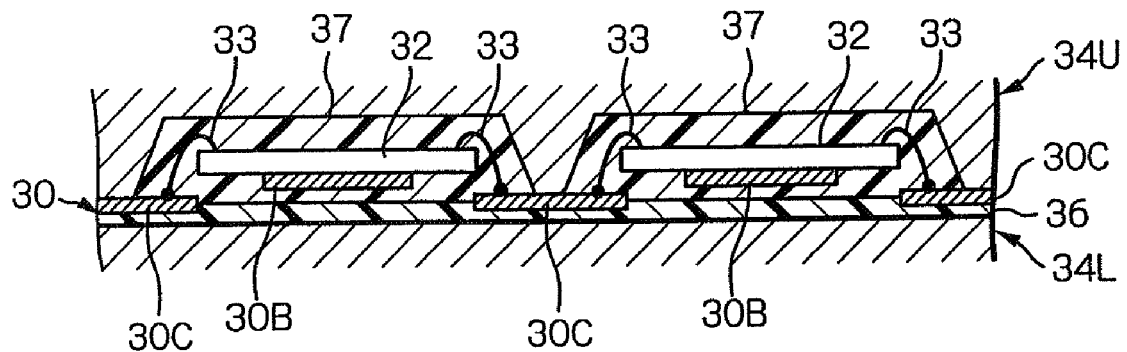
FIG. 7C is a cross-sectional view of the metal electrode subjected to a resin-molding process, for explaining a third representative step of the second conventional production process.
Figure 7D:
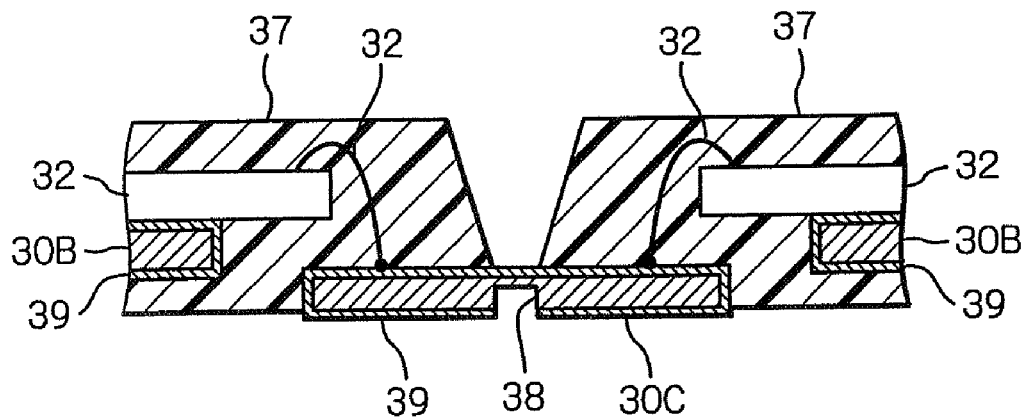
FIG. 7D is an enlarged cross-sectional view of the resin-molded metal electrode frame subjected to a half-cutting process, for explaining a fourth representative step of the second conventional production process.

After the mounting of the semiconductor chips 32 on the plate-like mounts 30B, the metal electrode frame 30 carrying the semiconductor chips 32 is subjected to a molding process, as shown in FIG. 7C. In particular, the metal electrode frame 30 carrying the semiconductor chips 32 is received in a molding cavity defined by lower and upper mold dies 34L and 34U. In this case, a suitable resin sheet 36 is placed on an inner bottom surface of the lower mold die 34L, and the metal electrode frame 30 is pressed against the resin sheet 36 such that the elongated electrodes 30C are partially plunged in the resin sheet 36, as shown in FIG. 7C. Then, a suitable uncured resin material is introduced into the molding cavity, to thereby produce a plurality of molded resin envelopers 37, each of which encapsulates and seals a corresponding plate-like mount 30B carrying the semiconductor chips 32, with the elongated electrodes 30C associated therewith being partially sealed in the molded resin enveloper 37 concerned.

After the molding process, the resin-molded metal electrode frame 30 is removed from the molding cavity, and is then subjected to a partial-cutting process. In particular, as representatively shown in FIG. 7D, each of the elongated electrodes 30C is partially cut at the exposed bottom surface thereof, using a suitable rotary cutting blade (not shown), whereby a cutting groove 38 is formed in the exposed bottom surface of the elongated electrode 30C. Note, in FIG. 7D, the silver-plating layer of the metal electrode frame 30 is indicated by reference 39.

After the partial-cutting process, as shown in FIG. 7E, the resin-molded metal electrode frame 30 is subjected to a silver-electroplating process in which an additional silver-plating layer 40 is formed on each of the bottom surfaces of the elongated electrodes 30C. Then, as shown in FIG. 7F, the resin-molded metal electrode frame 30 is subjected to a full-cutting process in which each of the elongated electrodes 30C is fully cut, using a suitable rotary cutting blade (not shown), whereby the molded resin envelopers 37 are completely separated from each other as a plurality of leadless type semiconductor packages. Thus, as is apparent from FIG. 7F, in each of the leadless type semiconductor packages, each of the cut elongated electrodes 30C features a cutting face 41 partially covered with the silver-plating layer 40.

As shown in FIG. 8, this leadless type semiconductor package is mounted on a wiring board 42. In particular, the wiring board 42 has a circuit pattern formed thereon, and the circuit pattern includes a plurality of electrode pads 43 (only one of which is representatively shown in FIG. 8), which are made of a suitable metal material, such as copper, aluminum or the like, and which are electroplated with silver. Also, the electrode pads 43 are arranged so as to have a mirror image relationship with respect to the arrangement of the elongated electrodes 30C, and thus the leadless type semiconductor package can be placed on the wiring board 42 such that the respective elongated electrodes 30C are in contact with the electrode pads 43. In short, the respective elongated electrodes 30C are soldered on the electrode pads 43, using silver paste, resulting in a completion of the mounting of the leadless type semiconductor package on the wiring board 43. Note, in FIG. 8, the soldering of the elongated electrode 30C is representatively indicated by reference SP.

As is apparent from FIG. 8, when each of the elongated electrodes 30C is soldered on the electrode pad 43, a solder fillet is produced along the cutting face 41 of elongated electrodes 30C, because of the silver-plating area of the cutting face 41, which is partially covered with the additional silver-plating layer 40, and which exhibits an excellent adhesive property to the silver paste. Since the produced solder fillet features a relatively large extent, it is possible to obtain a sufficient soldering strength between the elongated electrode 30C and the electrode pad 43.

However, the second conventional production process fails to manufacture the semiconductor package at a low cost, because of the additional processes, i.e. the partial-cutting process (FIG. 7D), the silver-electroplating process (FIG. 7E) and the full-cutting process (FIG. 7F).

First Embodiment

With reference to FIGS. 9A, 9B, 9C, 10A, 10B, 11A, 11B, 12A, 12B, 13A and 13B, a first embodiment of a production process for manufacturing a plurality of leadless type semiconductor package according to the present invention is explained below.

Figure 9A:
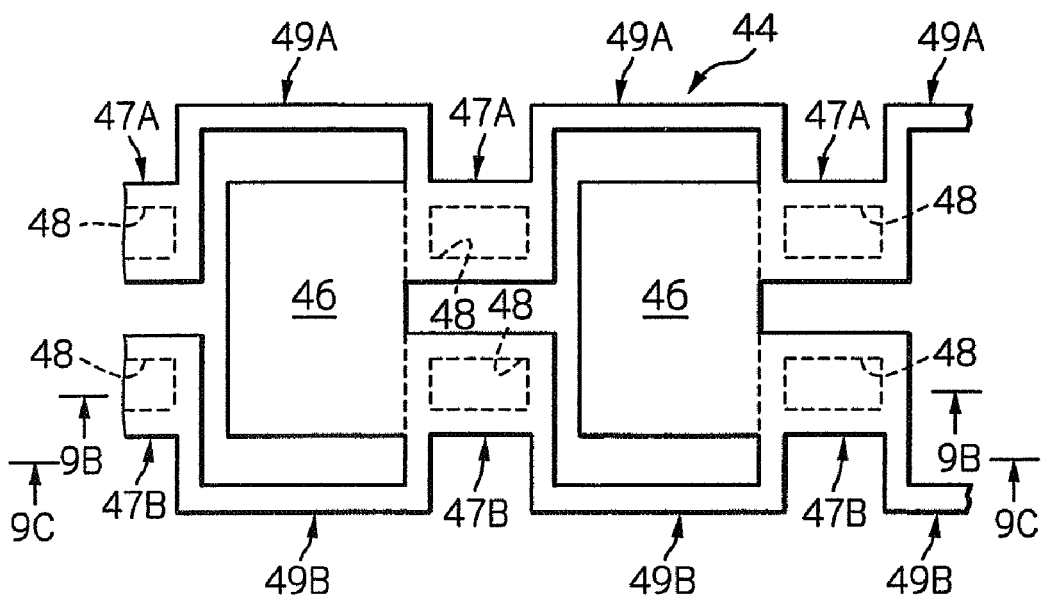
FIG. 9A is a plan view of a metal electrode frame, for explaining a first representative step of a first embodiment of a production process for manufacturing a plurality of leadless type resin-sealed semiconductor packages according to the present invention.
Figure 9B:
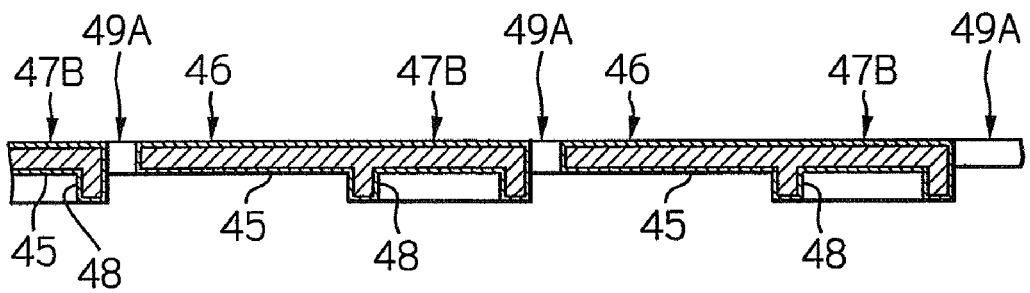
FIG. 9B is a cross-sectional view taken along the 9B-9B line of FIG. 9A.
Figure 9C:
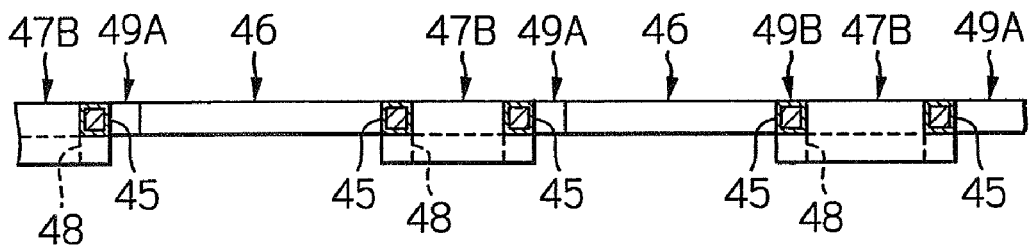
FIG. 9C is a cross-sectional view taken along the 9C-9C line of FIG. 9A.

First, as shown in FIGS. 9A, 9B and 9C, a metal electrode frame 44 is prepared. The metal electrode frame 44 is made of a suitable metal material, such as copper, brass or the like, and is wholly electroplated with silver. Note, in FIGS. 9B and 9C, the silver-plating layer is indicated by reference 45.

The metal electrode frame 44 includes a plurality of rectangular islands or plate-like mounts 46, each of which has two rectangular electrodes 47A and 47B integrally joined to and extended from a side thereof. As best shown in FIG. 9B, each of the electrodes 47A and 47B is approximately two times thicker than the plate-like mount 46, and has a rectangular recess 48 formed in a bottom surface thereof. Also, as best shown in FIG. 9A, two adjacent electrodes 47A are integrally joined to each other by a handle-shaped side tie-bar element 49A, and two adjacent electrode 47B is integrally joined to each other by a handle-shaped side tie-bar element 49B.

Figure 10A:
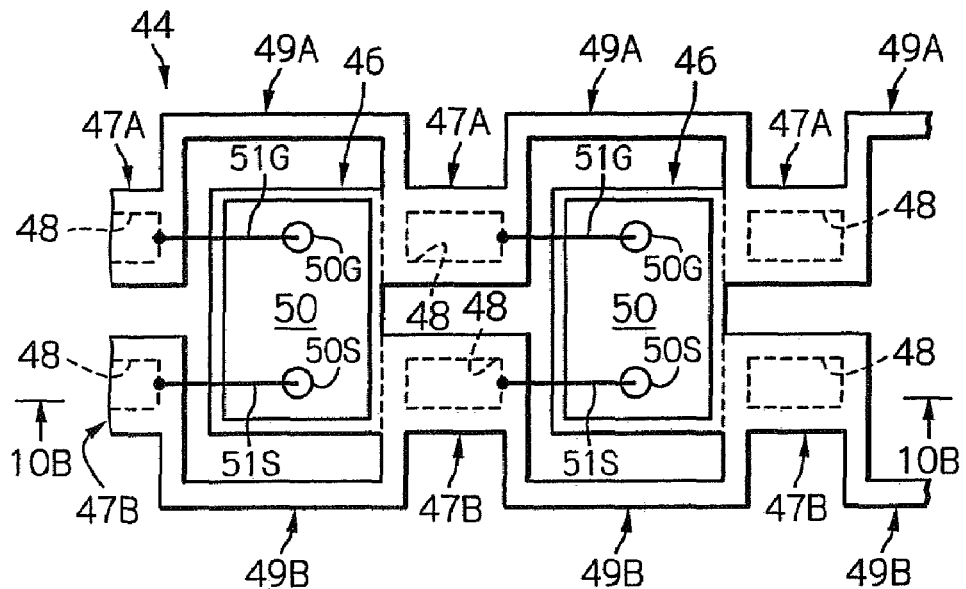
FIG. 10A is a plan view of the metal electrode frame having semiconductor chips mounted thereon, for explaining a second representative step of the first embodiment of the production process according to the present invention.
Figure 10B:
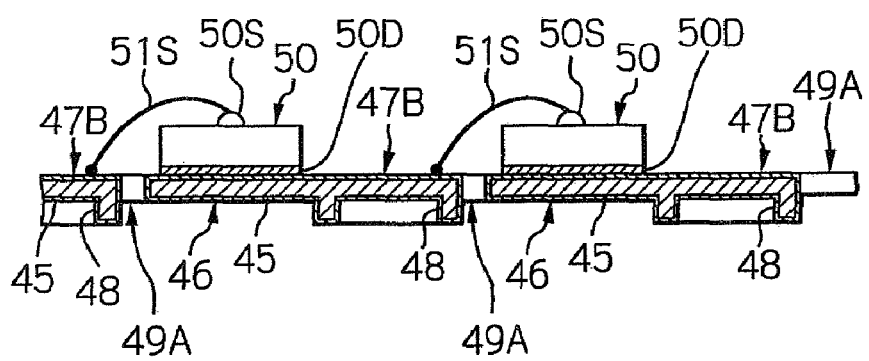
FIG. 10B is a cross-sectional view taken along the 10B-10B line of FIG. 10A.

After the preparation of the metal electrode frame 44, as shown in FIGS. 10A and 10B, respective semiconductor chips 50 are mounted on the plate-like electrodes 46. In this embodiment, each of the semiconductor chips 50 is constructed as a vertical type power metal oxide semiconductor field effect transistor (MOSFET) chip. Namely, the MOSFET chip 50 has a drain electrode layer 50D (FIG. 10B) formed as a lowermost layer thereof, and the drain electrode layer 50D is electrically adhered to the plate-like mount 46 with a suitable conductive adhesive agent, such as silver paste. Also, the MOSFET chip 50 has two gate and source electrode terminals 50G and 50S bonded on respective gate and source electrode pads (not shown) formed on a top surface thereof, and the respective gate and source electrode terminals 50G and 50S are electrically connected to the electrodes 47A and 47B with bonding wires 51G and 51S.

After the mounting of the MOSFET chips 50 on the plate-like mounts 46, the metal electrode frame 44 carrying the MOSFET chips 50 is subjected to a molding process, as shown in FIGS. 11A, 11B, 12A and 12B.

Figure 11A:
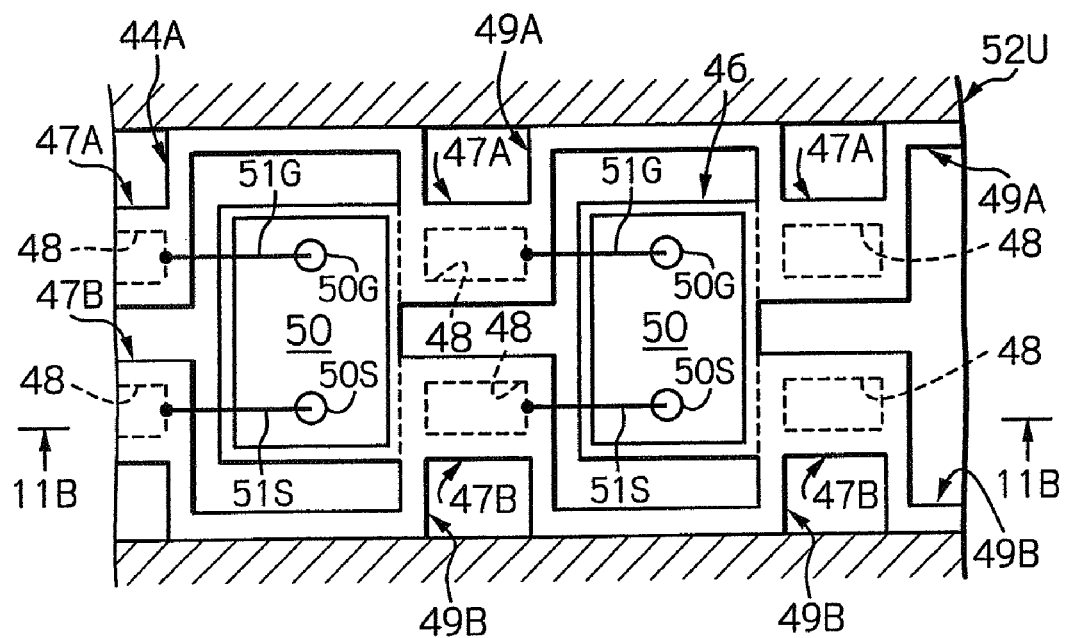
FIG. 11A is a horizontal cross-sectional view of a mold die, taken along the 11A-11A line of FIG. 11B, in which the metal electrode frame carrying the semiconductor chips is received, for explaining a third representative step of the first embodiment of the production process according to the present invention.
Figure 11B:
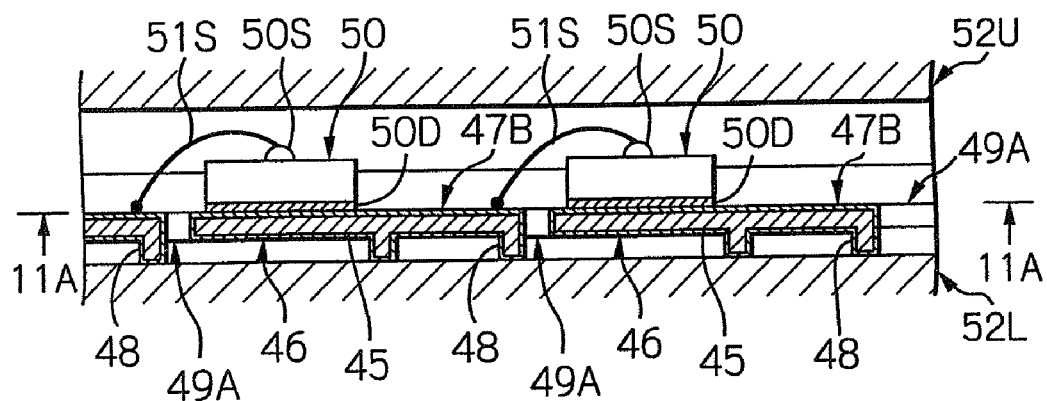
FIG. 11B is a cross-sectional view taken along the 11B-11B line of FIG. 11A.

In particular, as shown in FIGS. 11A and 11B, the metal electrode frame 44 carrying the MOSFET chips 50 is received in a molding cavity defined by lower and upper mold dies 52L and 52U. As is apparent from FIG. 11B, all the electrodes 47A and 47B are in contact with an inner bottom surface of the lower mold die 52L, and thus the recesses 48 thereof are completely closed by the inner bottom surface of the lower mold die 52L. Note, in FIG. 11A, only the lower mold die 52L is shown in a cross-sectional view taken along the 11A-11A line of FIG. 11B.

Figure 12A:
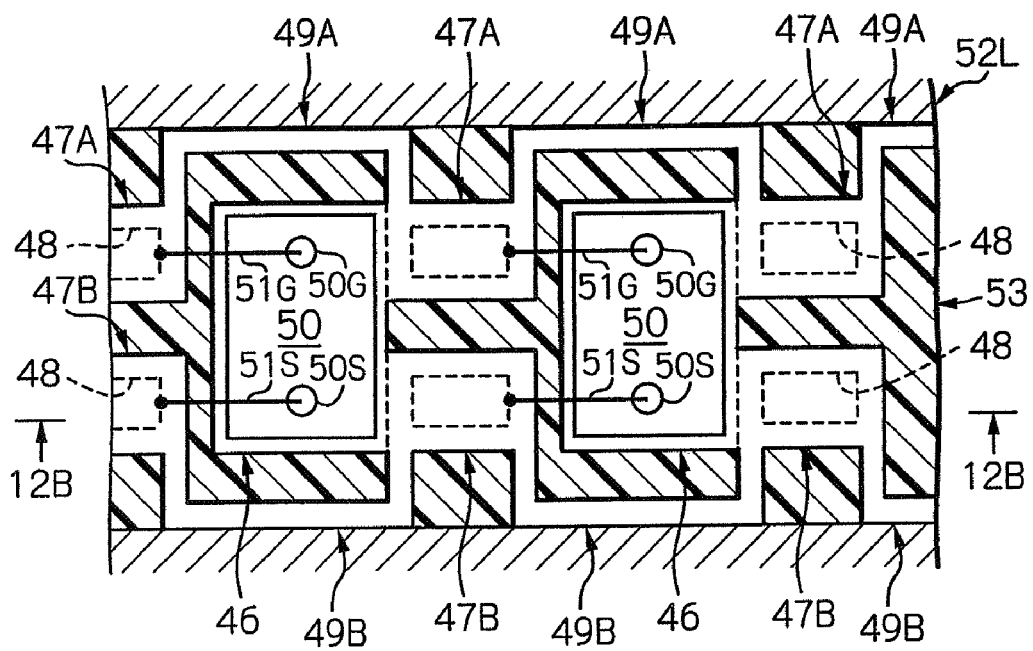
FIG. 12A is a horizontal cross-sectional view of the mold die, taken along the 12A-12A line of FIG. 12B, in which the metal electrode frame carrying the semiconductor chips is molded with a resin material, for explaining a fourth representative step of the first embodiment of the production process according to the present invention.
Figure 12B:
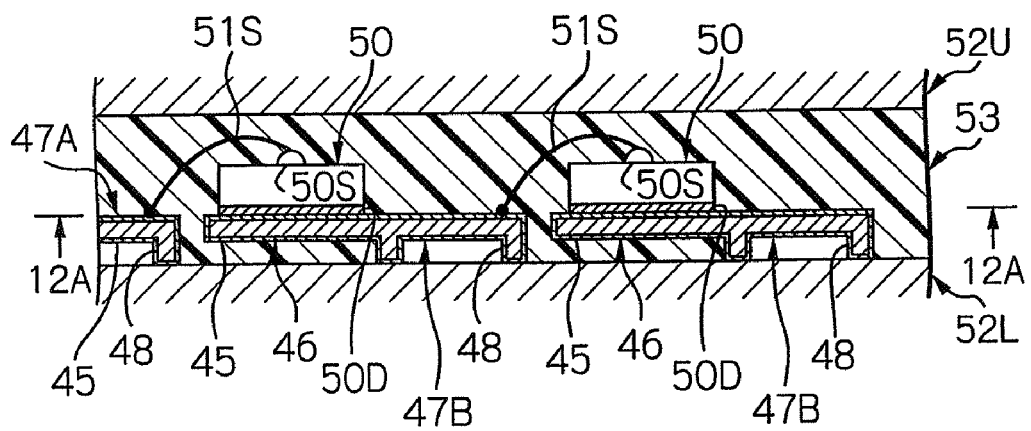

Thereafter, as shown in FIGS. 12A and 12B, a suitable uncured resin material is introduced into the molding cavity, to thereby produce a molded resin envelopers 53 encapsulating and sealing the metal electrode frame 44 carrying the MOSFET chips 50. However, as best shown in FIG. 12B, the uncured resin material cannot be introduced into the recesses 48 of the electrodes 47A and 47B because these recesses 48 are completely closed by the inner bottom surface of the lower mold die 52L. Note, in FIG. 12A, only the molded resin enveloper 53 and the lower mold die 52L are shown in a cross-sectional view taken along the 12A-12A line of FIG. 12B.

Figure 13A:
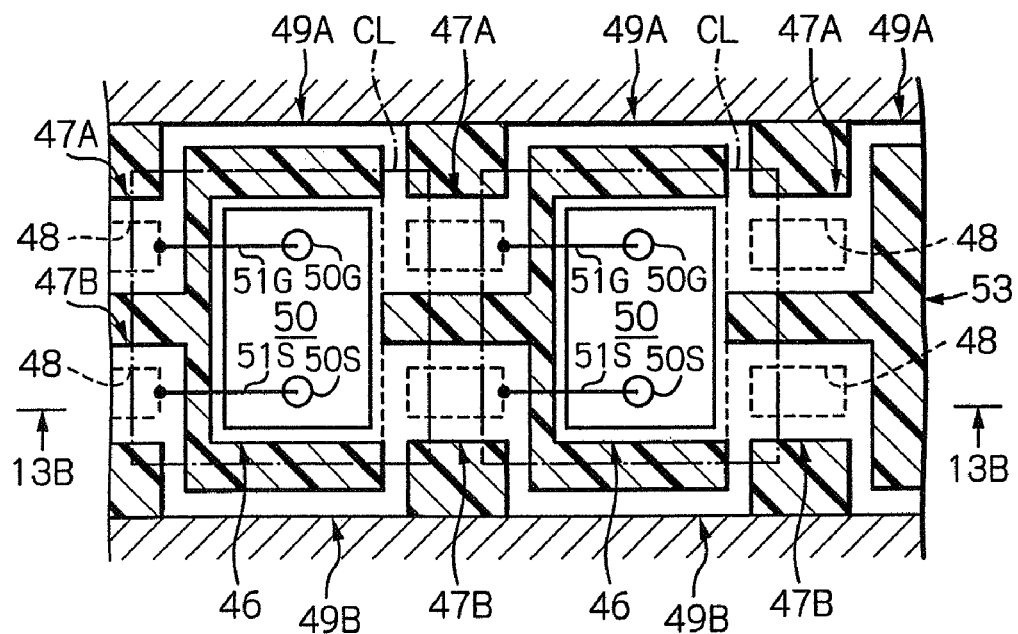
FIG. 13B is a horizontal cross-sectional view taken along the 13B-13B line of FIG. 13A.
Figure 13B:
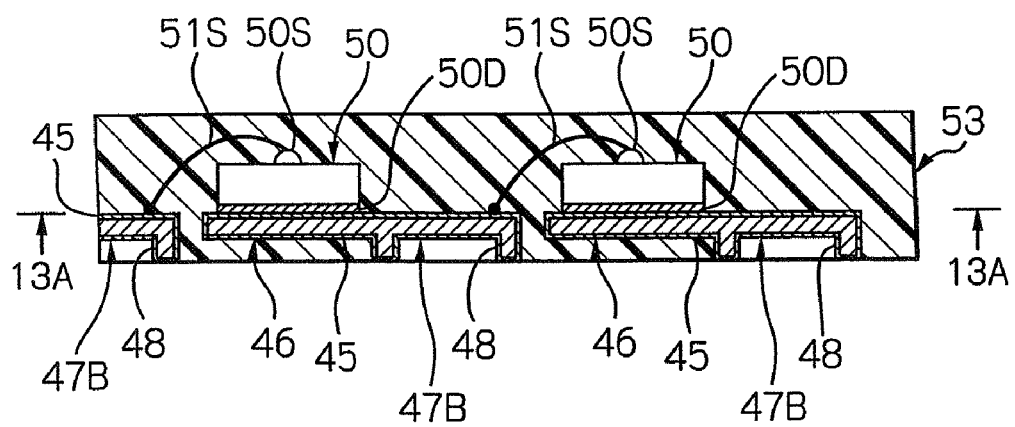

After the molding process, the molded resin enveloper 53 encapsulating and sealing the metal electrode frame 44 with the MOSFET chips 50 is removed from the molding cavity of the lower and upper mold dies 52L and 52U, as shown in FIGS. 13A and 13B. Subsequently, the molded resin enveloper 53 encapsulating and sealing the metal electrode frame 44 with the MOSFET chips 50 is subjected to a cutting process in which it is cut along rectangular cutting lines CL, represented by single-dot chain lines in FIG. 13A, to thereby produce a plurality of leadless type resin-sealed semiconductor packages.

Figure 14:
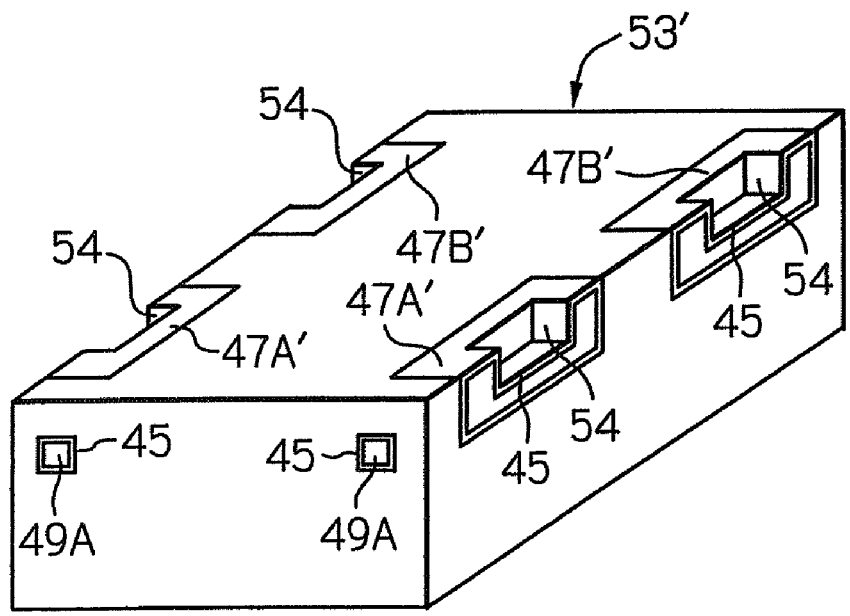
FIG. 14 is a perspective view of the leadless type resin-sealed semiconductor package manufactured by the first embodiment of the production process according to the present invention.

With reference to FIG. 14, one of the produced leadless type resin-sealed semiconductor packages is representatively shown in a perspective view. This leadless type resin-sealed semiconductor package has a resin enveloper section 53' which is cut from the molded resin enveloper, and the resin enveloper section 53' itself serves as a resin enveloper encapsulating and sealing the plate-like mount 46 together with the semiconductor chip 50.

In FIG. 14, the leadless type resin-sealed semiconductor package is illustrated in an upside-down manner, and a bottom surface of the resin enveloper 53' functions as a mounting face to be applied to a wiring board. Four side faces of the resin enveloper 53' are associated with the mounting face to produce four right-angle edges. Two sets of electrode terminals 47A' and 47B', which are cut from the two sets of electrodes 47A and 47B, are partially buried in a pair of right-angled edges opposed to each other so as to be exposed to an outside.

As is apparent from FIG. 14, each of the electrode sections 47A' and 47B' has an angular depression 54 derived from a corresponding rectangular recess 48 of the electrode (47A, 47B). Namely, the angular depression 54 is defined by a set of inner end faces opposed to each other, and a set of two right-angled faces extending between the opposed inner end faces, and these faces are provided with the silver-plating layer 45.

Note, in this embodiment, although each of the angular depressions 54 is formed as a right-angled depression due to the rectangular configuration of the recess 48, it may be formed as a rounded depression.

Figure 15:
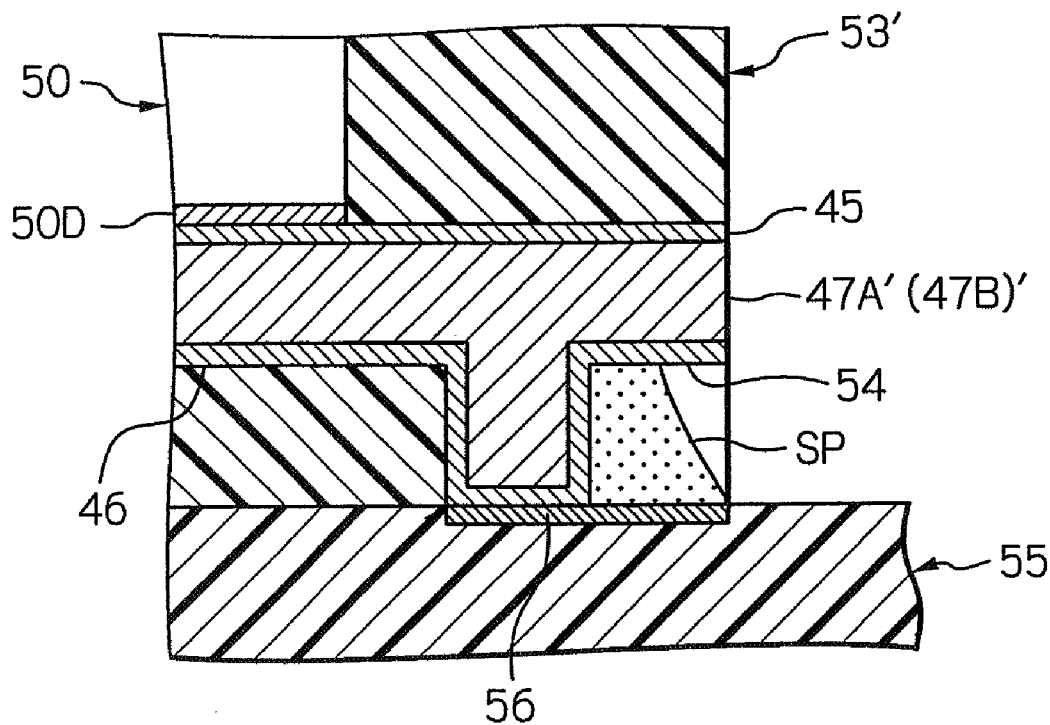
FIG. 15 is a cross-sectional view of the leadless type resin-sealed semiconductor of FIG. 14, which is mounted on a wiring board.

As shown in FIG. 15, this leadless type semiconductor package is mounted on a wiring board 55. In particular, the wiring board 55 has a circuit pattern formed thereon, and the circuit pattern includes four electrode pads 56 (only one of which is representatively shown in FIG. 15). Each of the electrode pads 56 is made of a suitable metal material, such as copper, aluminum or the like, and are electroplated with silver. Also, the electrode pads 56 are arranged so as to have a mirror image relationship with respect to the arrangement of the four sections 47A' and 47B', and thus the leadless type semiconductor package can be placed on the wiring board 55 such that the respective sections 47A' and 47B' are in contact with the four electrode pads 56. In short, the respective electrode sections 47A' and 47B' are soldered on the four electrode pads 56, using silver paste, resulting in a completion of the mounting of the leadless type semiconductor package on the wiring board 55. Note, in FIG. 15, the soldering of the electrode section 47A' (47B') is representatively indicated by references SP.

As is apparent from FIG. 15, when each of the silver electrode sections 47A' and 47B' are soldered on a corresponding electrode pad 56, a solder fillet is produced between the faces defining the angular depression 54 and the silver-plated electrode pad 56. According to the present invention, an extent of the produced solder fillet is very large because the faces defining the angular depression 54 features a relatively-large surface area exhibiting an excellent adhesive property to the silver paste. Thus, it is possible to obtain a sufficient soldering strength between the faces defining the angular depression 54 and the silver-plated electrode pad 56, and therefore, a sufficient mounting strength between the leadless type semiconductor package and the wiring board 55 can be obtained.

Also, as is apparent from FIG. 15, it is very easy to visually inspect whether or not a configuration of the produced solder fillet is proper because the angular depression 54 is shaped so as to be opened to an outside.

Second Embodiment

With reference to FIGS. 16A, 16B, 17A and 17B, a second embodiment of a production process for manufacturing a plurality of leadless type semiconductor package according to the present invention is explained below.

Figure 16A:
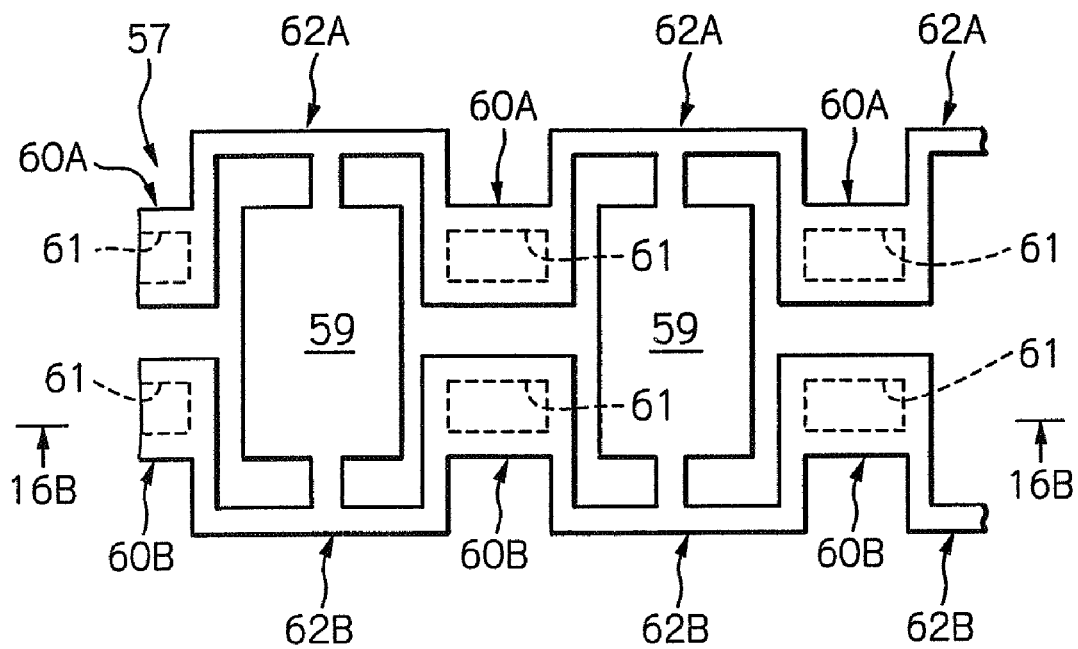
FIG. 16A is a plan view of a metal electrode frame, for explaining a first representative step of a second embodiment of a production process for manufacturing a plurality of leadless type resin-sealed semiconductor packages according to the present invention.
Figure 16B:
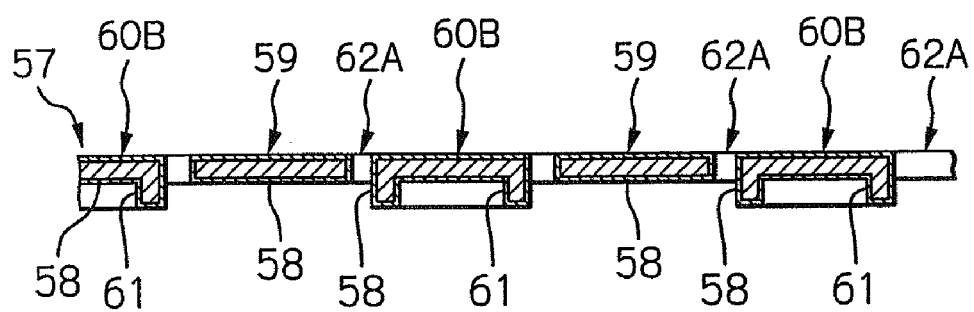
FIG. 16B is a cross-sectional view taken along the 16B-16B line of FIG. 16A.

First, as shown in FIGS. 16A and 16B, a metal electrode frame 57 is prepared. The metal electrode frame 57 is made of a suitable metal material, such as copper, brass or the like, and is wholly electroplated with silver. Note, in FIG. 16B, the silver-plating layer is indicated by reference 58.

The metal electrode frame 57 includes a plurality of rectangular islands or plate-like mounts 59, and plural sets of rectangular electrodes 60A and 60B alternately arranged with respect to the plate-like mounts 59. Namely, each set of rectangular electrodes 60A and 60B is displaced between two adjacent plate-like mounts 59. As shown in FIG. 16B, each of the electrodes 60A and 60B is approximately two times thicker than the plate-like mount 59, and has a rectangular recess 61 formed in a bottom surface thereof. Also, as shown in FIG. 16A, two adjacent electrodes 60A and a plate-like mount 59 disposed therebetween are integrally joined to each other by a generally E-shaped side tie-bar element 62A, and two adjacent electrodes 60B and a plate-like mount 59 disposed therebetween are integrally joined to each other by a generally E-shaped side tie-bar element 62B.

Figure 17A:
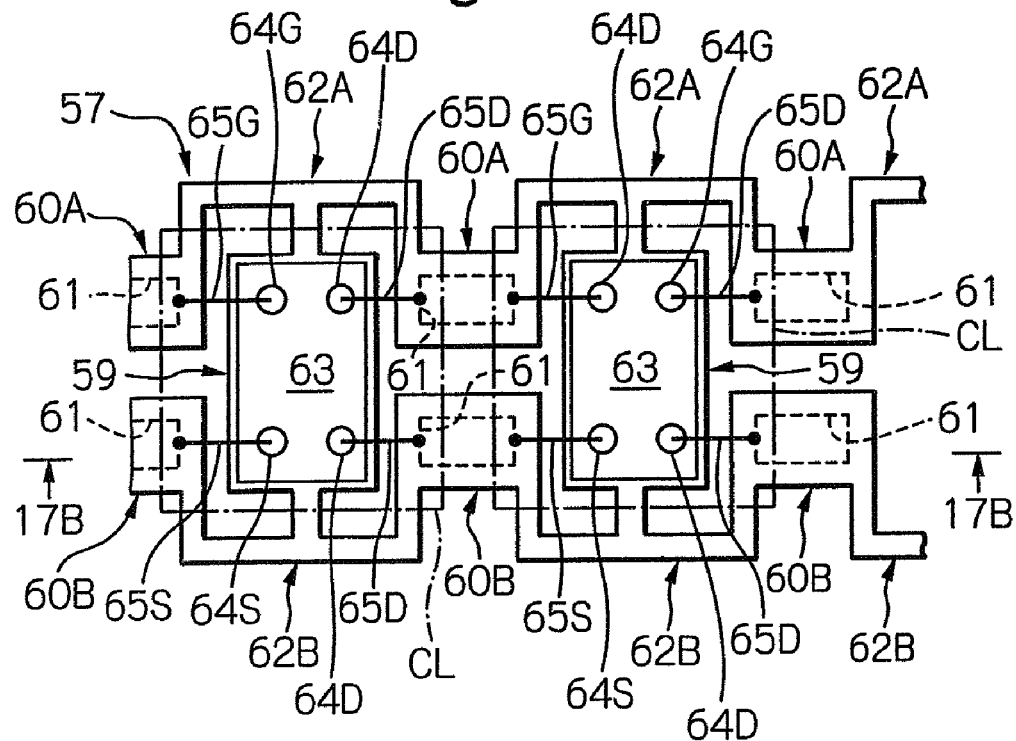
FIG. 17A is a plan view of the metal electrode frame having semiconductor chips mounted thereon, for explaining a second representative step of the second embodiment of the production process according to the present invention.
Figure 17B:
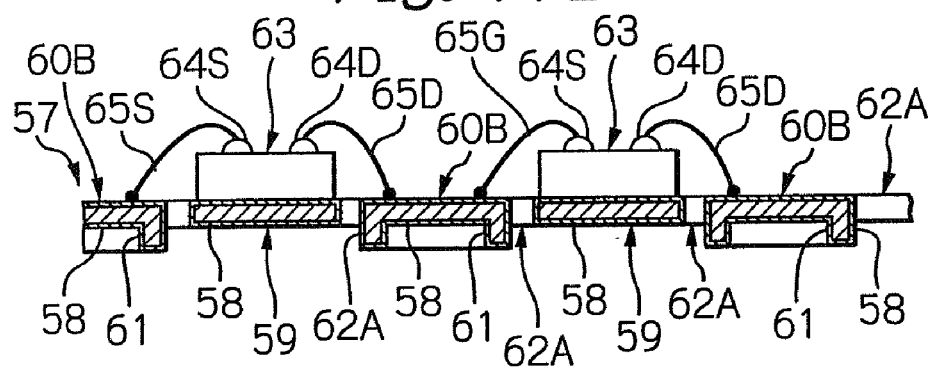
FIG. 17B is a cross-sectional view taken along the 17B-17B line of FIG. 17A.

After the preparation of the metal electrode frame 57, as shown in FIGS. 17A and 17B, respective semiconductor chips 63 are mounted on the plate-like electrodes 59. In this embodiment, each of the semiconductor chips 50 is constructed as a power metal oxide semiconductor field effect transistor (MOSFET) chip. For example, the MOSFET chip 63 has two drain electrode terminals 64D bonded on respective drain electrode pad (not shown) formed on a top surface thereof, and two gate and source electrode terminals 64G and 64S bonded on respective gate and source electrode pads (not shown) formed on the top surface thereof. The respective two drain electrode terminals 64D are electrically connected to the electrodes 60A and 60B, placed adjacent to one side of the plate-like mount 59, with bonding wires 65D, and the respective two gate and source electrode terminals 64G and 64S are electrically connected to the electrodes 60G and 60S, placed adjacent to the other side of the plate-like mount 59, with bonding wires 65G and 65S.

After the mounting of the MOSFET chips 63 on the plate-like mounts 59, the metal electrode frame 57 carrying the MOSFET chips 63 is subjected to a molding process in substantially the same manner as the above-mentioned first embodiment (FIGS. 11A, 11B, 12A and 12B).

Namely, a molded resin enveloper encapsulating and sealing the metal electrode frame 57 carrying the MOSFET chips 63 is produced, and is then cut along rectangular cutting lines CL, represented by single-dot chain lines in FIG. 17A, to thereby produce a plurality of leadless type resin-sealed semiconductor packages.

Figure 18:
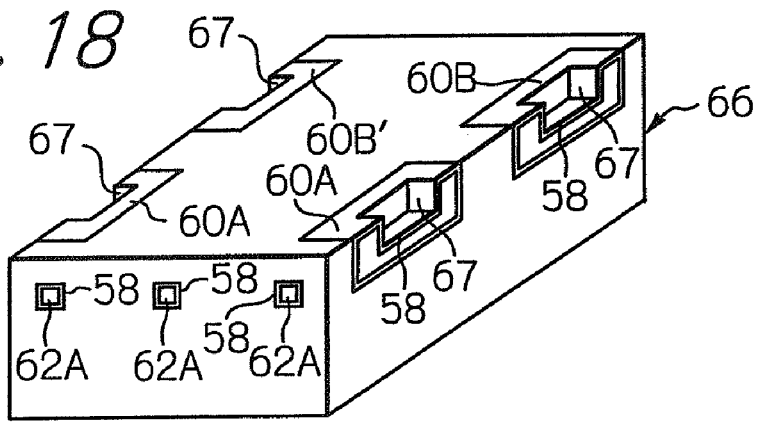
FIG. 18 is a perspective view of the leadless type resin-sealed semiconductor package manufactured by the second embodiment of the production process according to the present invention.

With reference to FIG. 18, one of the leadless type resin-sealed semiconductor packages produced by the second production process according to the present invention is representatively shown in a perspective view. This leadless type resin-sealed semiconductor package has substantially the same appearance as the package manufactured by the first embodiment of the production process according to the present invention. Namely, the leadless type resin-sealed semiconductor package has a resin enveloper section 66 which is cut from the molded resin enveloper, and the resin enveloper section 66 itself serves as a resin enveloper encapsulating and sealing the plate-like mount 59 together with the semiconductor chip 63.

In FIG. 18, the leadless type resin-sealed semiconductor package is illustrated in an upside-down manner, and a bottom surface of the resin enveloper 66 functions as a mounting face to be applied to a wiring board. Four side faces of the resin enveloper 66 are associated with the mounting face to produce four right-angle edges. Two sets of electrode terminals 60A' and 60B', which are cut from the two sets of electrodes 60A and 60B, are partially buried in a pair of right-angled edges opposed to each other so as to be exposed to an outside.

As is apparent from FIG. 18, each of the electrode sections 60A' and 60B' has an angular depression 67 derived from a corresponding rectangular recess 61 of the electrode (60A, 60B). Namely, similar to the above-mentioned first embodiment, the angular depression 67 is defined by a set of inner end faces opposed to each other, and a set of two right-angled faces extending between the opposed inner end faces, and these faces are provided with the silver-plating layer 58, and thus it is possible to improve a mounting strength the leadless type semiconductor package on a wiring board for the same reason as mentioned above. Also, it is possible to visually and easily inspect a configuration of a solder fillet which is produced when each of the electrode sections (60A' and 60B') is soldered on an electrode pad on a wiring board.

Note, similar to the above-mentioned first embodiment, although each of the angular depressions 67 is formed as a right-angled depression due to the rectangular configuration of the recess 61, it may be formed as a rounded depression.

Third Embodiment

With reference to FIGS. 19A, 19B, 20A and 21, a third embodiment of a production process for manufacturing a plurality of leadless type semiconductor package according to the present invention is explained below.

Figure 19A:
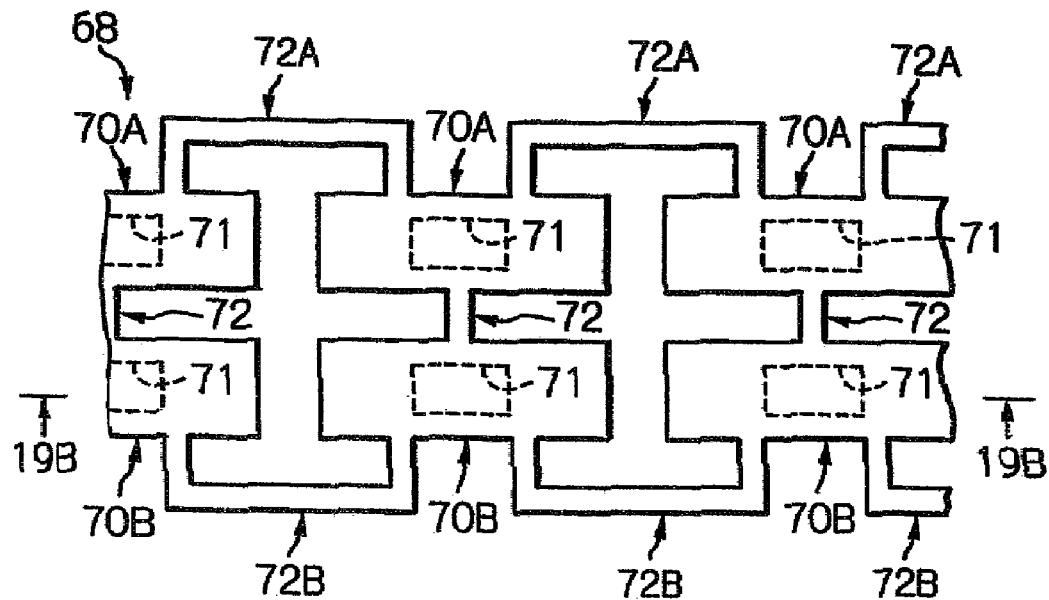
FIG. 19A is a plan view of a metal electrode frame, for explaining a first representative step of a third embodiment of a production process for manufacturing a plurality of leadless type resin-sealed semiconductor packages according to the present invention.
Figure 19B:
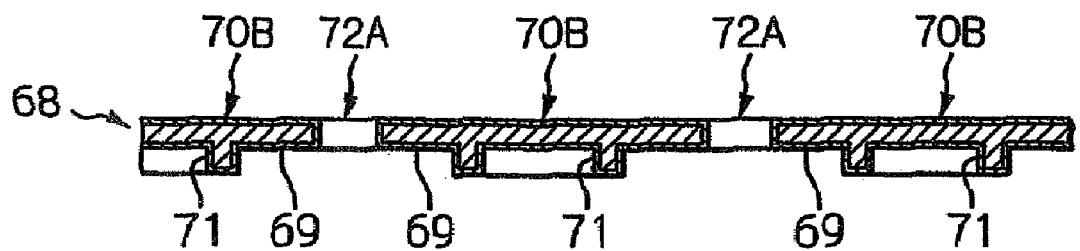
FIG. 19B is a cross-sectional view taken along the 19B-19B line of FIG. 19A.

First, as shown in FIGS. 19A and 19B, a metal electrode frame 68 is prepared. The metal electrode frame 68 is made of a suitable metal material, such as copper, brass or the like, and is wholly electroplated with silver. Note, in FIG. 19B, the silver-plating layer is indicated by reference 69.

The metal electrode frame 68 includes plural sets of elongated rectangular electrodes 70A and 70B aligned with each other. As is apparent from FIG. 19B, each of the electrodes 70A and 70B has a thickened center portion which is approximately two times thicker than the end portions thereof, and a rectangular recess 71 is formed in a bottom surface of the thickened center portion. Also, as shown in FIG. 19B, the electrodes 70A and 70B in each set are integrally joined to each other by a tie-bar element 72. Further, two adjacent electrodes 70A are integrally joined to each other by a handle-shaped shaped side tie-bar element 72A, and two adjacent electrodes 70B are integrally joined to each other by a handle-shaped shaped side tie-bar element 72B.

Figure 20A:
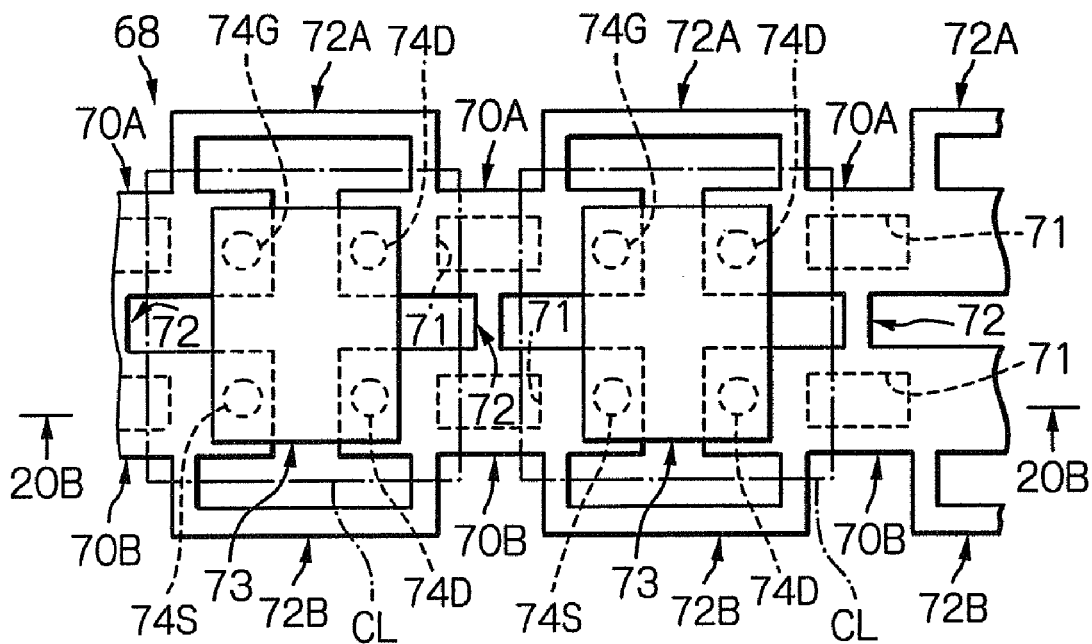
FIG. 20A is a plan view of the metal electrode frame having semiconductor chips mounted thereon, for explaining a second representative step of the third embodiment of the production process according to the present invention.
Figure 20B:
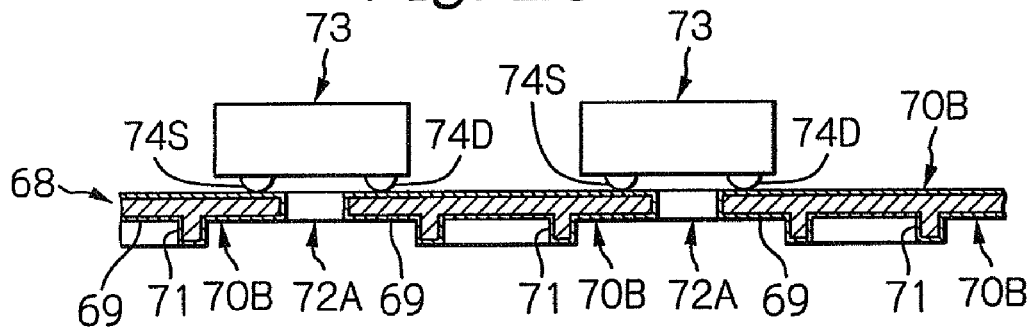
FIG. 20B is a cross-sectional view taken along the 20B-20B line of FIG. 20A.

After the preparation of the metal electrode frame 68, as shown in FIGS. 20A and 20B, a semiconductor chips 73, which may be constructed as a power metal oxide semiconductor field effect transistor (MOSFET) chip, is mounted on two adjacent sets of electrodes 70A and 70B in a face-down manner.

In particular, in this embodiment, the MOSFET chip 73 has two drain electrode terminals 74D bonded on respective drain electrode pads (not shown) formed on a top surface thereof, and two gate and source electrode terminals 74G and 74S bonded on respective gate and source electrode pads (not shown) formed on the top surface thereof. The MOSFET chip 73 is faced down and placed on two adjacent sets of electrodes 70A and 70B such that the set of electrode terminals 74D and 74G are in contact with the adjacent two electrodes 70A, and such that the set of electrode terminals 74D and 74S are in contact with the two adjacent electrodes 70B. Then, each of the electrode terminals 74D, 74D, 74G and 74S is bonded on a corresponding electrode (70A, 70B), using either an ultrasonic-pressure bonding method or a heat-pressure bonding method.

After the mounting of each of the MOSFET chips 73 on the two adjacent sets of electrodes 70A and 70B, the metal electrode frame 68 carrying the MOSFET chips 73 is subjected to a molding process in substantially the same manner as the above-mentioned first embodiment (FIGS. 11A, 11B, 12A and 12B).

Namely, a molded resin enveloper encapsulating and sealing the metal electrode frame 68 carrying the MOSFET chips 73 is produced, and is then cut along rectangular cutting lines CL, represented by single-dot chain lines in FIG. 20A, to thereby produce a plurality of leadless type resin-sealed semiconductor packages.

Figure 21:
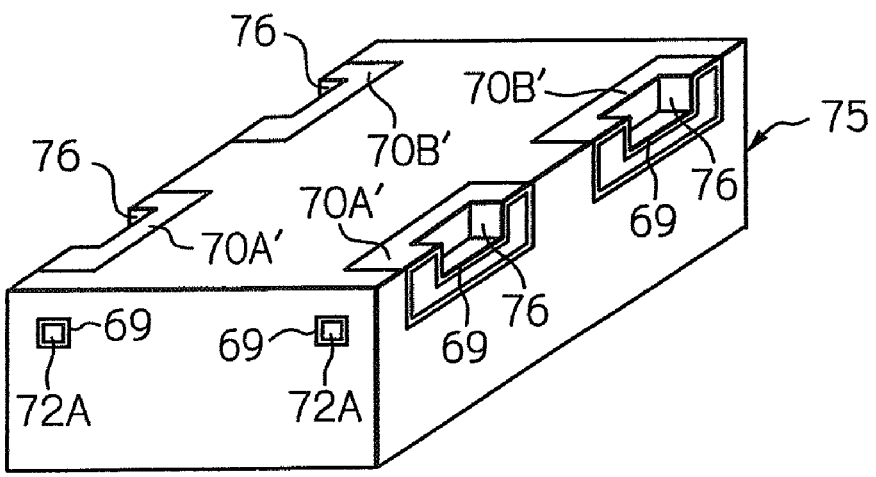
FIG. 21 is a perspective view of the leadless type resin-sealed semiconductor package manufactured by the third embodiment of the production process according to the present invention.

With reference to FIG. 21, one of the leadless type resin-sealed semiconductor packages produced by the third production process according to the present invention is representatively shown in a perspective view. This leadless type resin-sealed semiconductor package also has substantially the same appearance as the package produced by the first embodiment of the production process according to the present invention. Namely, The leadless type resin-sealed semiconductor package has a resin enveloper section 75 which is cut from the molded resin enveloper, and the resin enveloper section 75 itself serves as a resin enveloper encapsulating and sealing the semiconductor chip 73.

In FIG. 21, the leadless type resin-sealed semiconductor package is illustrated in an upside-down manner, and a bottom surface of the resin enveloper 75 functions as a mounting face to be applied to a wiring board. Four side faces of the resin enveloper 75 are associated with the mounting face to produce four right-angle edges. Two sets of electrode terminals 70A' and 70B', which are cut from the two sets of electrodes 70A and 70B, are partially buried in a pair of right-angled edges opposed to each other so as to be exposed to an outside.

As is apparent from FIG. 21, each of the electrode sections 70A' and 70B' has an angular depression 76 derived from a corresponding rectangular recess 71 of the electrode (70A, 70B). Namely, similar to the above-mentioned first embodiment, the angular depression 76 is defined by a set of inner end faces opposed to each other, and a set of two right-angled faces extending between the opposed inner end faces, and these faces are provided with the silver-plating layer 69, and thus it is possible to improve a mounting strength the leadless type semiconductor package on a wiring board for the same reason as mentioned above. Also, it is possible to visually and easily inspect a configuration of a solder fillet which is produced when each of the electrode sections (70A' and 70B') is soldered on an electrode pad on a wiring board. Note, similar to the above-mentioned first and second embodiments, although each of the angular depressions 76 is formed as a right-angled depression due to the rectangular configuration of the recess 71, it may be formed as a rounded depression.

Finally, it will be understood by those skilled in the art that the foregoing description is of preferred embodiments of the package, and that various changes and modifications may be made to the present invention without departing from the spirit and scope thereof.

What is claimed:

1. A production process for manufacturing a plurality of leadless type resin-sealed semiconductor packages, comprising:

preparing a metal electrode frame including a plurality of electrodes, each of which has a recess formed in a bottom surface thereof; preparing a plurality of semiconductor chips, each of which has at least one electrode terminal formed on a top surface thereof;

establishing an electrical connection between the at least one electrode terminal of each of said semiconductor chips and a corresponding one of the electrodes of said metal electrode frame;

molding said metal electrode frame and said semiconductor chips with a resin material to thereby form a molded resin enveloper that encapsulates said semiconductor chips, and that partially encapsulates the electrodes of said metal electrode frame so that the resin material is not introduced into the recesses of said electrodes, such that the bottom surfaces of said electrodes are exposed on an outer surface of said molded resin enveloper without being covered with the resin material; and cutting said molded resin enveloper into a plurality of leadless type resin-sealed semiconductor packages, each of which includes one of said semiconductor chips mounted on that portion of the electrode which bears the recess, and an outer electrode terminal cut off from one of the electrodes of said metal electrode frame, such that each of said outer electrode terminals is formed with a depression that is formed by cutting that portion of the corresponding electrode which bears the recess.

2. The production process as set forth in claim 1, wherein said metal electrode frame further includes a plurality of islands, each of which is associated with one of said electrodes;

said production process further comprising mounting each of said semiconductor chips on one of said islands before the establishing of said electrical connection is carried out.

3. The production process as set forth in claim 2, wherein each of said electrodes is integrally extended from a corresponding one of said islands, the establishing of said electrical connection is carried out by using a bonding wire.

4. The production process as set forth in claim 2, wherein each of said outer electrode terminals, cut off from said electrodes of said metal electrode frame (57), is separated from a corresponding one of said islands, the establishing of said electrical connection being carried out by using a bonding wire.

5. The production process as set forth in claim 1, wherein the establishing of said electrical connection is carried out by connecting the at least one electrode terminal of each of said semiconductor chips to a corresponding one of the electrodes of said metal electrode frame, without using a bonding wire.

6. The production process as set forth in claim 1, wherein the molding of said metal electrode frame and said semiconductor chips comprises:

receiving said metal electrode frame carrying said semiconductor chips in a molding cavity defined by mold dies, each of said electrodes being in contact with an inner surface defining said molding cavity, so that the recess of each of said electrodes is closed by said inner surface;

introducing an uncured resin material into said molding cavity to thereby form said molded resin enveloper; and removing said molded resin enveloper from said mold dies after the introduced resin material is cured.

7. The production process as set forth in claim 1, wherein said metal electrode frame is subjected to a surface treatment so as to exhibit an excellent adhesive property to a solder to be used.

8. The production process as set forth in claim 7, wherein said surface treatment comprises an electroplating process.

9. The production process as set forth in claim 1, wherein each of said semiconductor chips is defined as a vertical type metal oxide semiconductor filed effect transistor (MOSFET) chip having at least two electrode terminals formed on a top surface thereof, one of said at least two electrode terminal serving as a gate electrode terminal, another of said at least two electrode terminal serving as a source electrode terminal.

10. The production process as set forth in claim 1, wherein each of said outer electrode terminals has a plating layer formed on an inner wall face defining the depression thereof.

* * * * *